(12) United States Patent
Udrea-Spenea et al.

(10) Patent No.: US 8,648,417 B1
(45) Date of Patent: Feb. 11, 2014

(54) LDMOS TRANSISTORS WITH IMPROVED ESD CAPABILITY

(71) Applicants: Marian Udrea-Spenea, Campbell, CA (US); Viorel Alexandru Marinescu, San Jose, CA (US)

(72) Inventors: Marian Udrea-Spenea, Campbell, CA (US); Viorel Alexandru Marinescu, San Jose, CA (US)

(73) Assignee: O2Micor, Inc., Santa Clara, CA (US)

( * ) Notice: Subject to any disclaimer, the term of this patent is extended or adjusted under 35 U.S.C. 154(b) by 0 days.

(21) Appl. No.: 13/632,617

(22) Filed: Oct. 1, 2012

(51) Int. Cl.
*H01L 29/66* (2006.01)

(52) U.S. Cl.
USPC ............ 257/343; 257/336; 257/339; 257/344

(58) Field of Classification Search
USPC ................. 257/336, 339, 343, 344, E29.007, 257/E29.012, E29.014, E29.015, E29.024, 257/E29.027, E29.256, E29.261, E29.281
See application file for complete search history.

(56) References Cited

U.S. PATENT DOCUMENTS

| | | | | |
|---|---|---|---|---|
| 7,161,198 | B2 * | 1/2007 | Omi et al. | 257/288 |
| 7,554,160 | B2 * | 6/2009 | Nakamura | 257/361 |
| 7,618,870 | B2 * | 11/2009 | Pan et al. | 438/306 |
| 2003/0049907 | A1 * | 3/2003 | Omi et al. | 438/286 |
| 2006/0186469 | A1 * | 8/2006 | Nakamura | 257/343 |
| 2012/0175673 | A1 * | 7/2012 | Lee | 257/140 |

* cited by examiner

*Primary Examiner* — Fernando L Toledo
*Assistant Examiner* — Christine C Lau

(57) ABSTRACT

A laterally-diffused metal-oxide-semiconductor (LDMOS) transistor includes a first well of a first conductivity type, a source of a second conductivity type formed in the first well, a drift region of the second conductivity type formed in the first well, and a second well of the second conductivity type formed in the first well and below the drift region. The drift region is separated from the source. The LDMOS transistor further includes a drain of the second conductivity type formed in the drift region, and includes a concentrator of the second conductivity type formed in the drift region and separated from the drain. A distance between the concentrator and the source is less than a distance between the drain and the source.

18 Claims, 25 Drawing Sheets

LDMOS TRANSISTORS WITH IMPROVED ESD CAPABILITY

BACKGROUND

Electrostatic discharge (ESD) is a sudden flow of electricity between objects caused by contact, electrical short, or dielectric breakdown. Integrated circuits are made from semiconductor materials such as silicon and insulating materials such as silicon dioxide. These materials may suffer permanent damage when subjected to high voltages resulted from an ESD event. Laterally diffused metal-oxide-semiconductor (LDMOS) transistors in an integrated circuit (IC) technology are widely used in power amplifiers for providing relatively high output power. Thus, an LDMOS transistor has a relatively high drain to source breakdown voltage, e.g., above 60 volts, compared to other devices such as gallium arsenide field effect transistors (GaAs FETs).

FIG. 1A illustrates a diagram of a cross section of a conventional LDMOS transistor 100. The LDMOS transistor 100 is built in a P-type substrate 110 and includes an N-type shallow drift region 108 in the substrate 110. The LDMOS transistor 100 further includes a body terminal 102, a source 104, and a drain 106. The body terminal 102 is a highly doped P-type region disposed in the substrate 110. The source 104 is a highly doped N-type region disposed in the substrate 110. The drain 106 is a highly doped N-type region disposed in the shallow drift region 108. A gate 124 is separated from the transistor body by a gate oxide 120 and a thick oxide 122.

A snap-back effect indicating a positive feedback condition may occur when an ESD pulse (e.g., up to 1,000 volts voltage within 1 micro second) is applied to the drain 106, e.g., due to unexpected contact, electrical short, or dielectric breakdown. More specifically, if an ESD pulse is applied to the drain 106, holes in a first region of the substrate 110 is depleted (e.g., the holes flow away through the source 104). Consequently, negative ionic charges emerge in the first region near a frontier 116 between the substrate 110 and the shallow drift region 108 (the first region is represented by "−" as shown in FIG. 1A). Moreover, electrons in a second region of the shallow drift region 108 are depleted (e.g., the electrons flow away through the drain 106). As a result, positive ionic charges emerge in the second region near the frontier 116 (the second region is represented by "+" as shown in FIG. 1A). The first region in the substrate 110 and the second region in the shallow drift region 108 constitute a depletion region in the LDMOS transistor 100. The negative ions and the positive ions establish high electric fields in the depletion region.

FIG. 1B illustrates another diagram of a cross section 120 of the LDMOS transistor 100. The depletion region in the transistor 100 includes multiple PN junctions at the frontier 116. For example, the regions A1 and A2 constitute a PN junction A1-A2; the regions B1 and B2 constitute a PN junction B1-B2; and the regions C1 and C2 constitute a PN junction C1-C2. Once the electric field of a PN junction reaches a threshold, e.g., when the voltage of the PN junction reaches a breakdown voltage, the PN junction is broken down and an avalanche multiplication effect is triggered to generate a large amount of electron-hole pairs. Therefore, the substrate current flowing from the drain 106 to the source 104 abruptly increases, which forward biases a PN junction between the source 104 and the substrate 110. Through the forward-biased PN junction, the source 108 continually provides electrons to the high electrical field region, further increasing the substrate current. Therefore, a positive feedback status (the snap-back effect) is established, during which the substrate current can continue to increase. Furthermore, as a great amount of holes emerge in the substrate 110, the voltage of the substrate 110 is increased, and thus the inverse voltage across the PN junction decreases.

The dopant density in the substrate 110 or the shallow drift region 108 is not uniformly distributed due to fabrication processes. PN junctions A1-A2, B1-B2, and C1-C2 are at different depths at the frontier 116. By way of example, in the substrate 116, the dopant density of the P-type region A1 can be greater than that of the region B1, which can be greater than that of the region C1. Similarly, in the shallow drift region 108, the dopant density of the N-type region A2 can be greater than that of the region B2, which can be greater than that of the region C2.

FIG. 1C shows a diagram 140 illustrating electric fields in the LDMOS transistor 100. An electric field at a particular position in the LDMOS transistor 100 is determined by the dopant density at the position and a distance Xd between the position and the frontier 116. As shown in FIG. 1C, the lines 142, 144, and 146 respectively show the electric fields of regions having dopant densities $D_{142}$, $D_{144}$, and $D_{146}$, where $D_{142}$ is greater than $D_{144}$ which is greater than $D_{146}$. The electric field decreases as the distance Xd increases. $X_{A2}$, $X_{B2}$, and $X_{C2}$ represent distances between the boundaries of the depletion regions and the frontier 116. At the distances $X_{A2}$, $X_{B2}$, and $X_{C2}$, the electric field decreases to zero. As shown in FIG. 1A (by way of example), an electric field at the point P1 is greater than an electric field at the point P2, because P1 is closer to the frontier 116 (assuming the dopant densities at the points P1 and P2 are the same). Moreover, if different positions have the same distance Xd and different dopant densities, then the position having a lower dopant density can have a higher electric field. For example, in FIG. 1C, at the same distance $X_{d1}$, the electric filed $E_{146}$ is greater than $E_{144}$, which is greater than $E_{142}$.

The breakdown voltage of a PN junction can be calculated according to an integral of the electric field with respect to the distance Xd. In other words, an area enclosed by a corresponding line 142, 144 or 146, axis Xd and axis E represents a breakdown voltage of a corresponding PN junction. For example, an area formed by the axis Xd, the axis E, and the line 142 represents a breakdown voltage $V_{142}$ for the PN junction having the dopant density $D_{142}$. An area formed by the axis Xd, the axis E, and the line 144 represents a breakdown voltage $V_{144}$ for the PN junction having the dopant density $D_{144}$. An area formed by the axis Xd, the axis E, and the line 146 represents a breakdown voltage $V_{146}$ for the PN junction having the dopant density $D_{146}$. In the example of FIG. 1C, the voltage $V_{142}$ is less than the voltage $V_{144}$, which is less than the voltage $V_{146}$. Therefore, as shown in FIG. 1B, a breakdown voltage $V_{A1-A2}$ at the PN junction A1-A2 is less than a breakdown voltage $V_{B1-B2}$ at the PN junction B1-B2, which is less than a breakdown voltage $V_{C1-C2}$ at the PN junction C1-C2.

FIG. 1D illustrates a diagram 160 of currents through PN junctions on the frontier 116 versus inverse voltages across the PN junctions. The curves 162, 164 and 166 represent the currents versus inverse voltages across the PN junctions A1-A2, B1-B2 and C1-C2, respectively. Taking the curve 162 for example, when an inverse voltage of the PN junction A1-A2 increases from zero volts to the breakdown voltage $V_{A1-A2}$, the current of the PN junction A1-A2 slightly increases from zero amperes. Once the inverse voltage reaches the breakdown voltage $V_{A1-A2}$, the PN junction A1-A2 is broken down. Then, the current of the PN junction A1-A2 rapidly increases because of the snap-back effect, and the inverse voltage across the PN junction A1-A2 decreases.

The PN junctions B1-B2 and C1-C2 operate similarly as the PN junction A1-A2 with respect to their own breakdown voltages $V_{B1\text{-}B2}$ and $V_{C1\text{-}C2}$.

However, the ESD performance of the LDMOS transistor 100 may be problematic. As discussed in relation to FIG. 1C, different PN junctions have different breakdown voltages. Thus, when an ESD pulse is applied to the drain 106, one PN junction on the frontier 116 is broken down while the others are not. For example, when the voltage of the drain 106 increases to the voltage $V_{A1\text{-}A2}$, e.g., due to an ESD pulse, only the PN junction A1-A2 is broken down to generate an abruptly increased current. At that moment, the PN junctions B1-B2 and C1-C2 experience relatively little current. Since large portions of energy are released through the relatively small regions A1 and A2, the abruptly increased current of the PN junction A1-A2 may damage the regions A1 and A2. As such, the LDMOS transistor 100 may be damaged, and the lifetime of the LDMOS transistor 100 may be shortened.

SUMMARY

Embodiments of the present invention provide a laterally-diffused metal-oxide-semiconductor (LDMOS) transistor. The LDMOS transistor includes a first well of a first conductivity type, a source of a second conductivity type formed in the first well, and a drift region of the second conductivity type formed in the first well. The drift region is separated from the source. The LDMOS transistor further includes a drain of the second conductivity type formed in the drift region, and includes a concentrator of the second conductivity type formed in the drift region and separated from the drain. A distance between the concentrator and the source is less than a distance between the drain and the source.

Embodiments of the present invention provide a method for fabricating a LDMOS transistor. The method includes: forming a source of a second conductivity type in a first well of a first conductivity type, forming a drift region of the second conductivity type in the first well, forming a drain of the second conductivity type in the drift region, and forming a concentrator of the second conductivity type and separated from the drain in the drift region. The drift region is separated from the source. A distance between the concentrator and the source is less than a distance between the drain and the source.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Figure 1A:
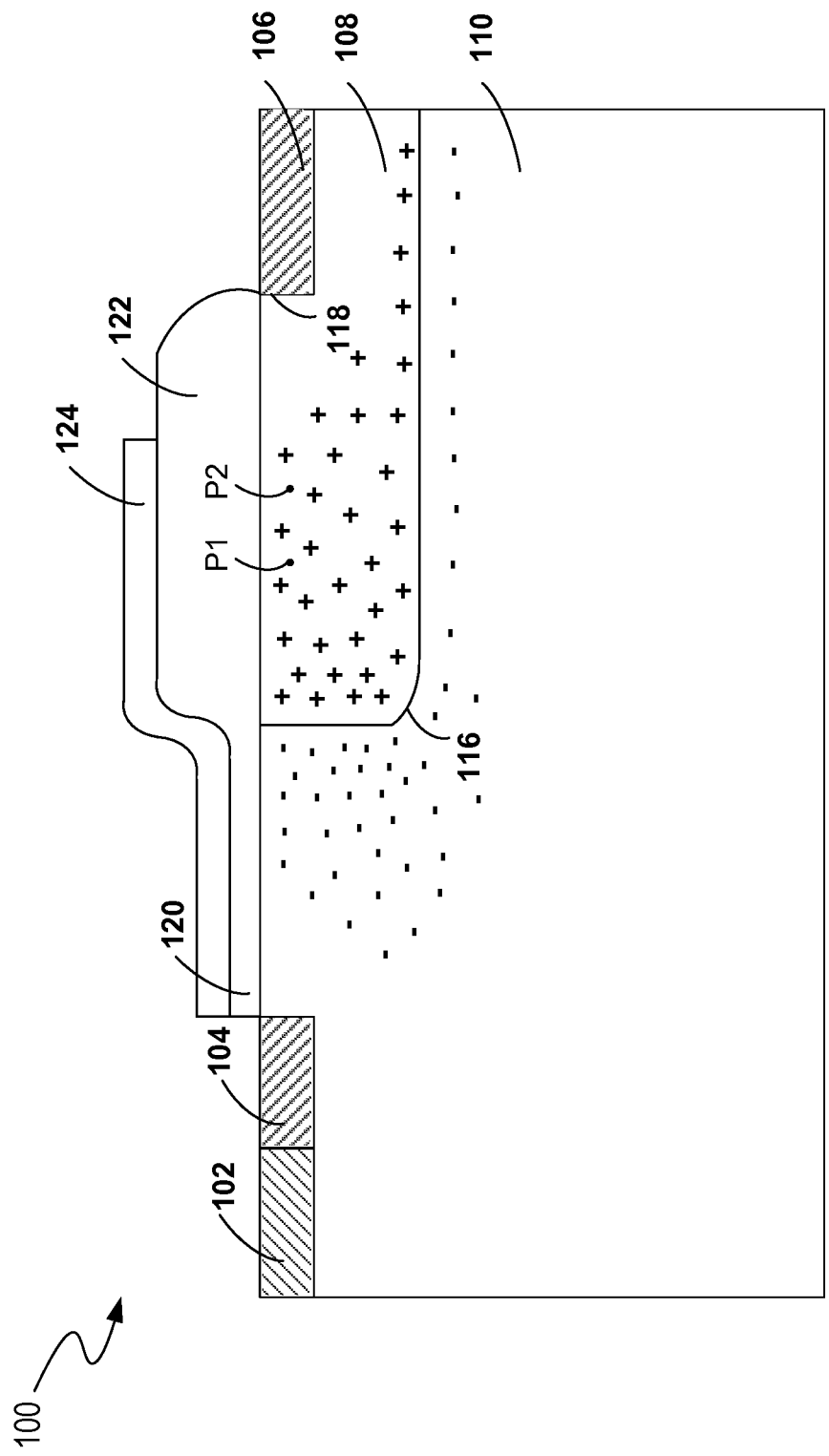
FIG. 1A illustrates a diagram of a cross section of a conventional LDMOS transistor.
Figure 1B:
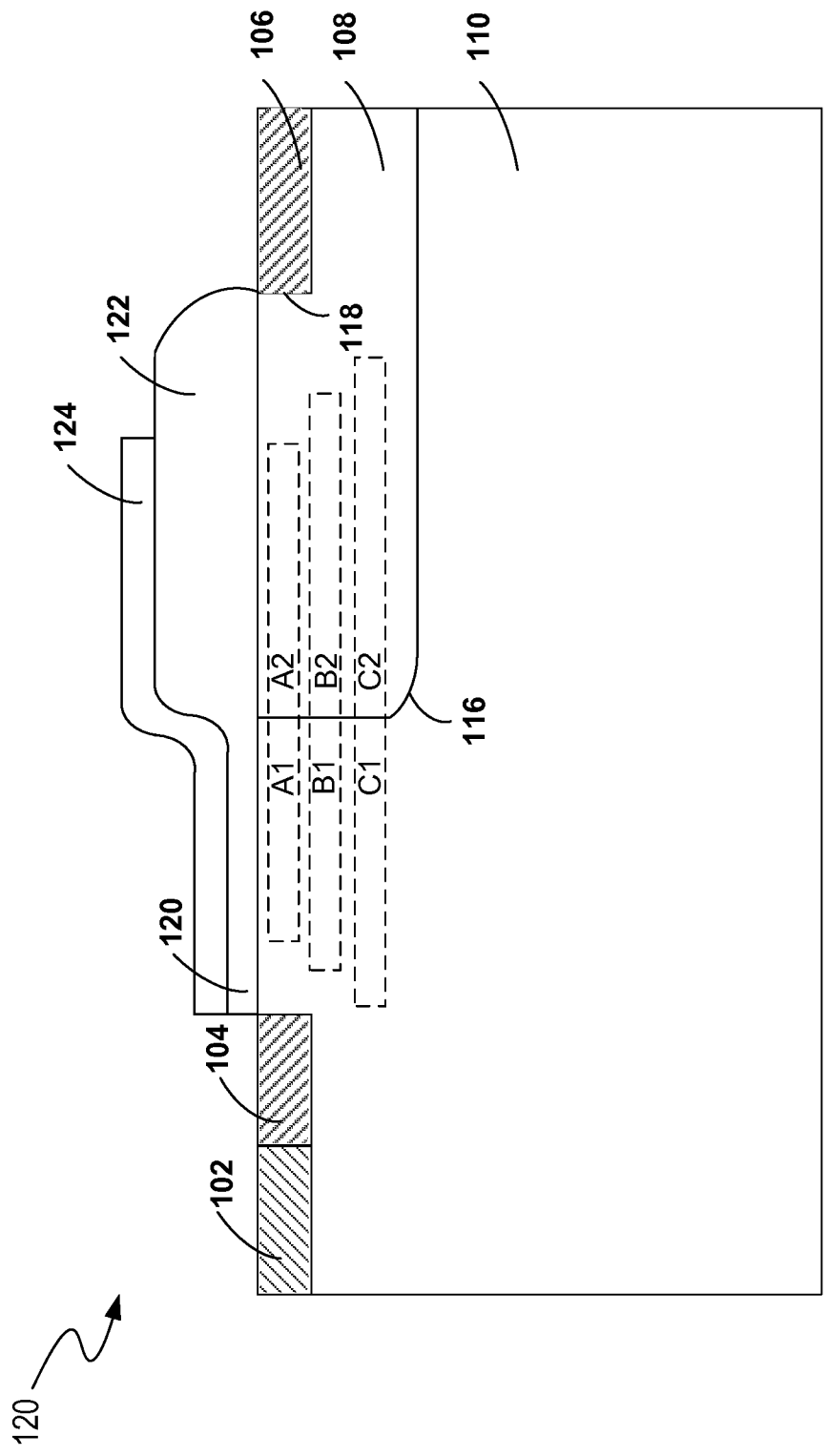
FIG. 1B illustrates another diagram of a cross section of a conventional LDMOS transistor.

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "growing," "etching," or the like, refer to actions and processes of semiconductor device fabrication.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the present invention can be implemented in conjunction with these other (perhaps conventional) processes and steps without significantly perturbing them. Generally speaking, embodiments in accordance with the present invention can replace portions of a conventional process without significantly affecting peripheral processes and steps.

Some of the figures are discussed in the context of one type of device; however, embodiments according to the present invention are not so limited. That is, the features described herein can be utilized in either an n-channel device or a p-channel device. The discussion of one type of device can be readily mapped to another type of device by substituting p-type dopant and materials for corresponding n-type dopant and materials, and vice versa.

Embodiments in accordance with the present invention pertain to a laterally-diffused metal-oxide-semiconductor (LDMOS) transistor. The LDMOS transistor includes a first well of a first conductivity type, a source of a second conductivity type formed in the first well, and a drift region of the second conductivity type formed in the first well. The drift region is separated from the source. The LDMOS transistor further includes a drain of the second conductivity type formed in the drift region, and includes a concentrator of the second conductivity type formed in the drift region and separated from the drain. The distance between the concentrator and the source is less than the distance between the drain and the source. Advantageously, if a PN junction in the LDMOS transistor is broken down when an ESD pulse is applied to the drain, other PN junctions can also be broken down to release energy. Thus, the breakdown current flowing through a single PN junction is reduced, which protects the LDMOS transistor from being damaged. Therefore, the ESD performance of the LDMOS transistor is enhanced, and the lifetime of the LDMOS transistor is lengthened.

Figure 7A:
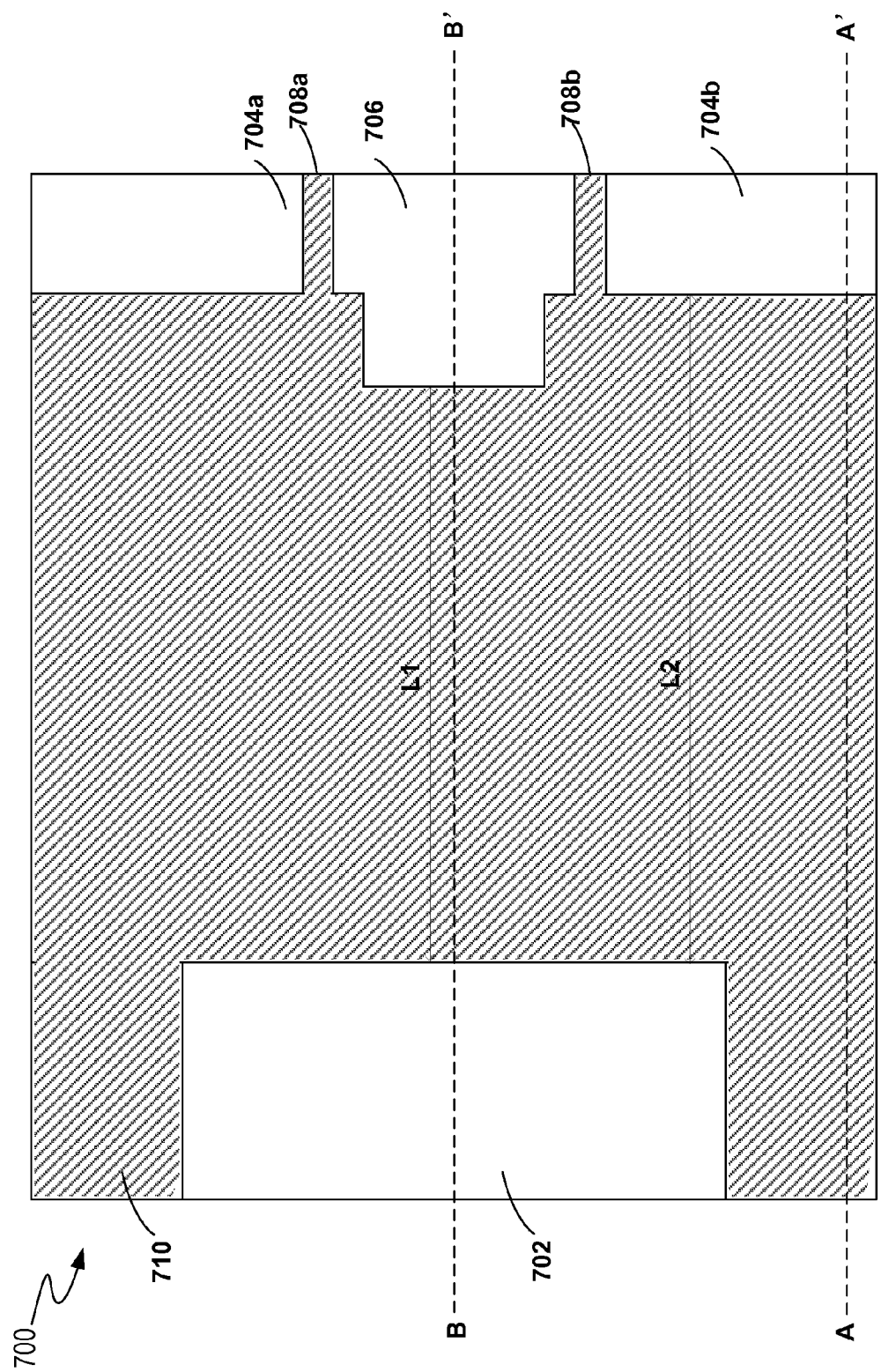
FIG. 7A shows an example of a mask used for forming a source, a drain, and a concentrator during a stage for fabricating an LDMOS transistor, in an embodiment according to the present invention.
Figure 7B:
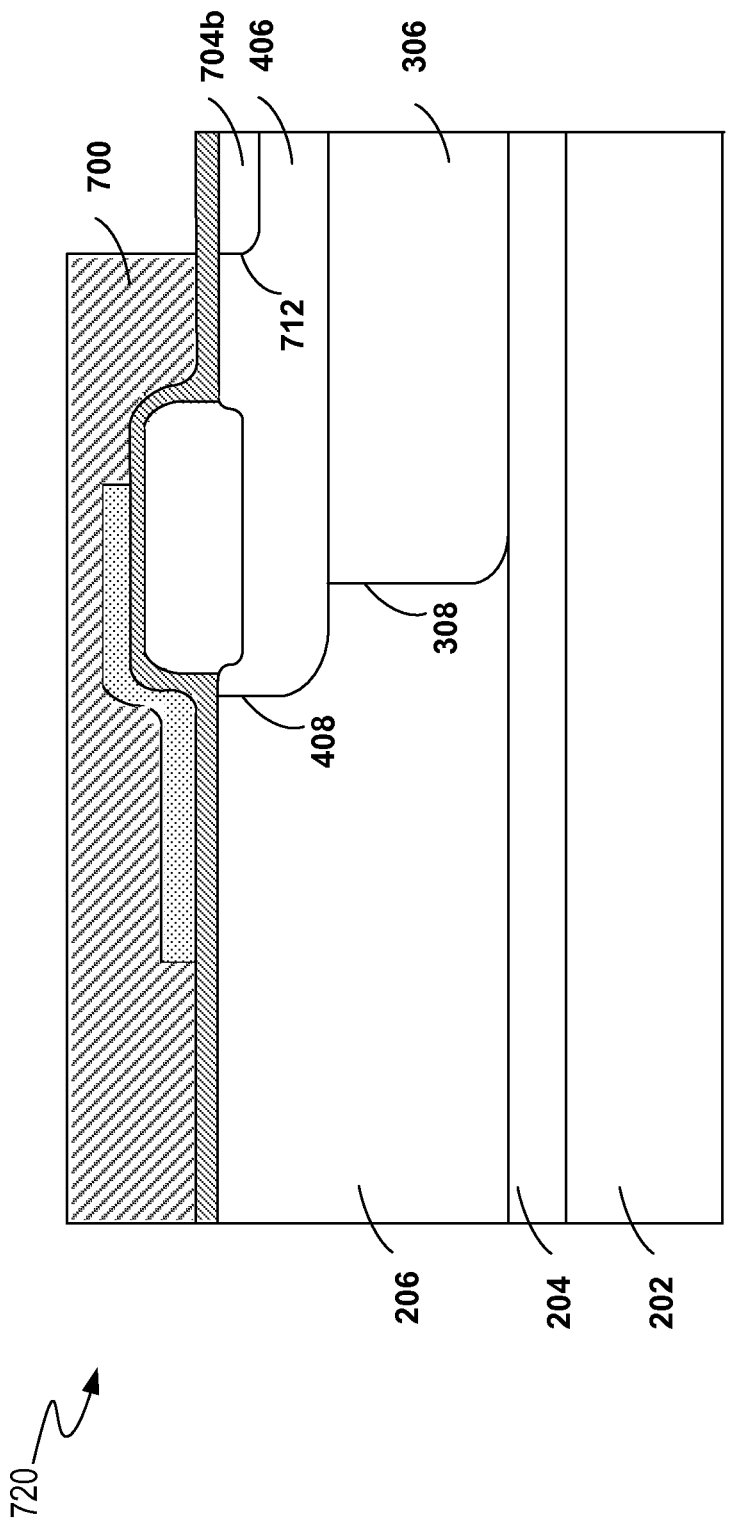
FIG. 7B and FIG. 7C show cross sections of an LDMOS transistor during a stage for fabricating an LDMOS transistor, in an embodiment according to the present invention.
Figure 7C:
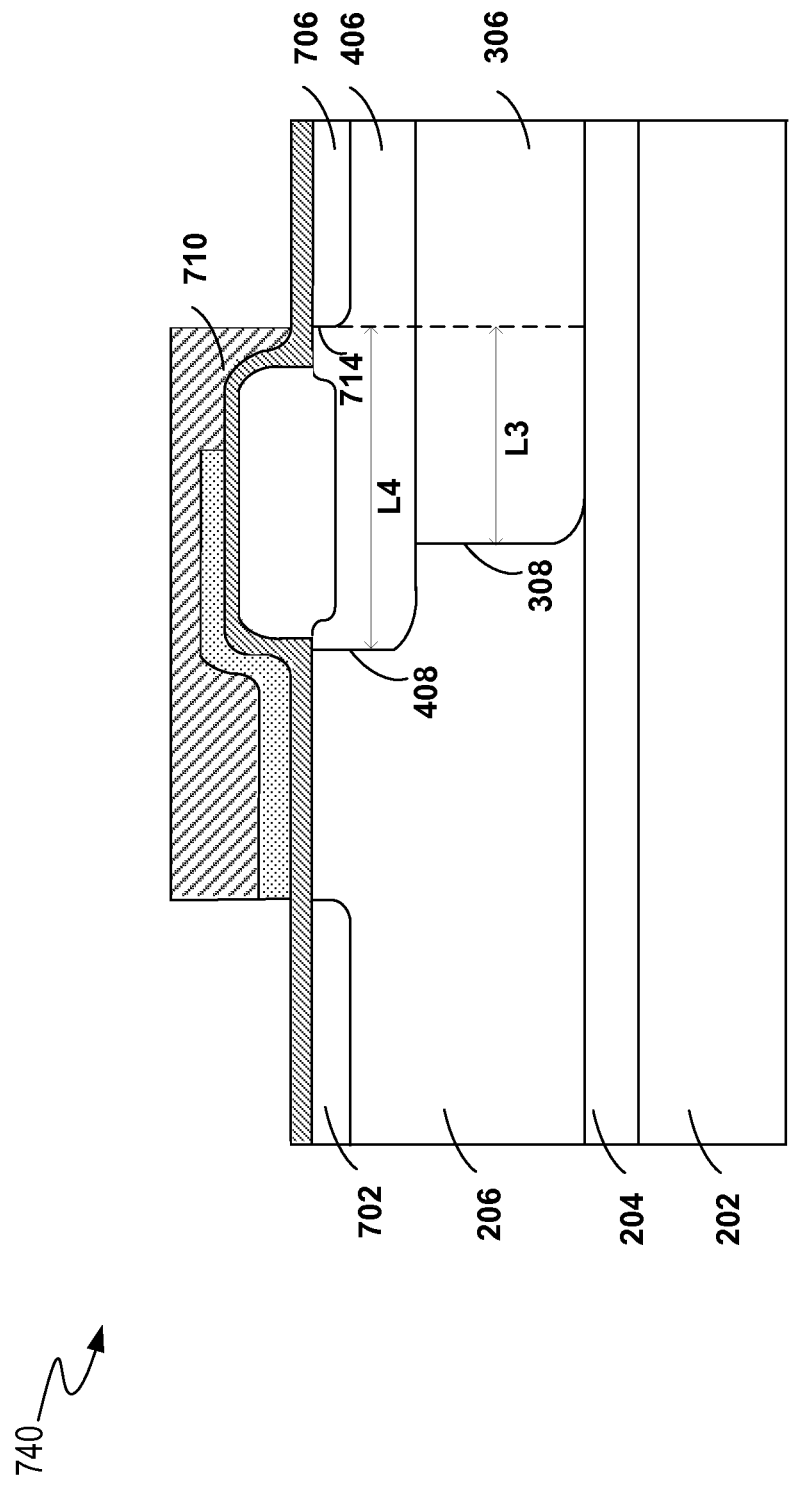
Figure 8A:
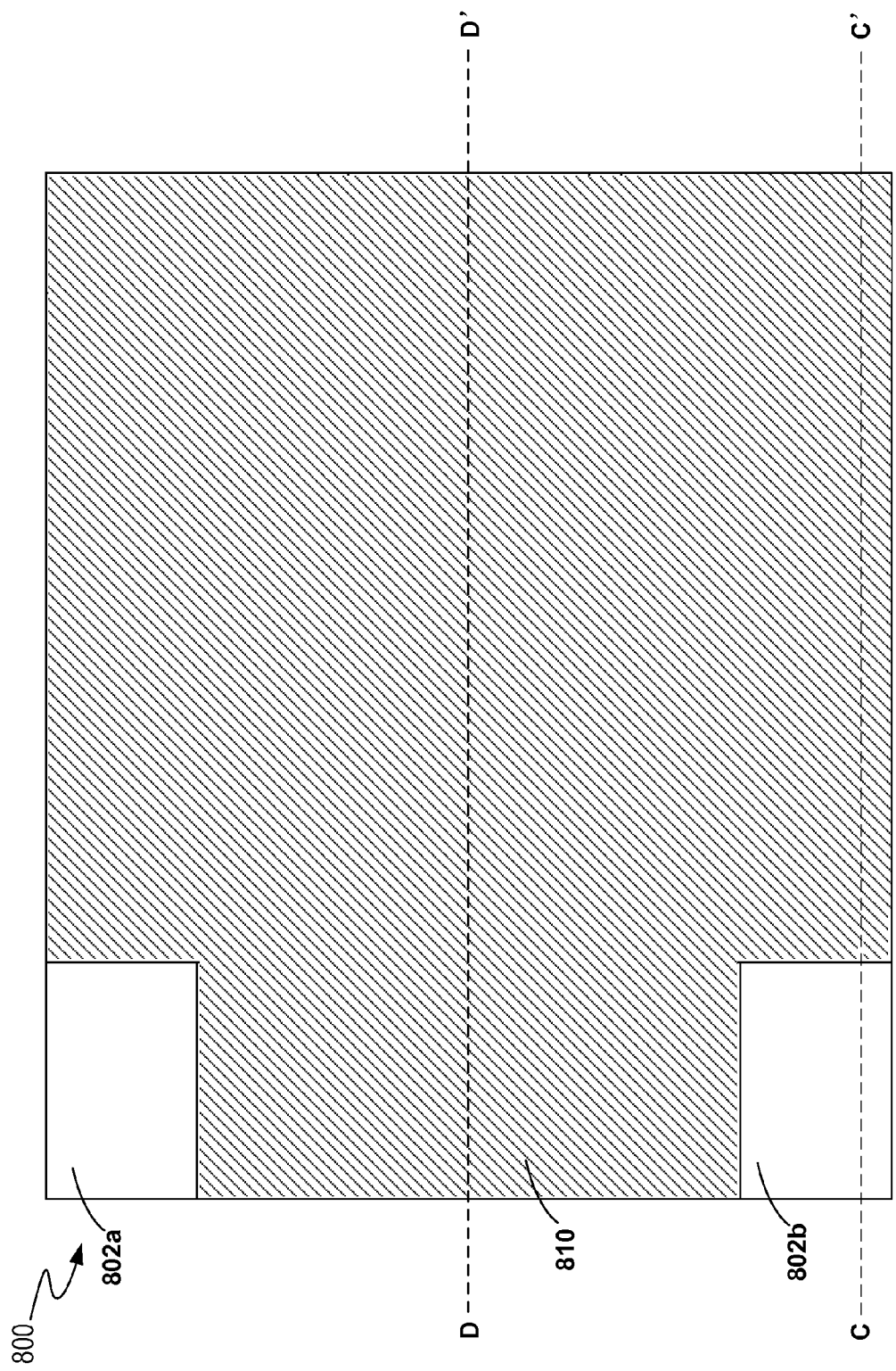
FIG. 8A shows an example of a mask for fabricating a substrate contact during a stage for fabricating an LDMOS transistor, in an embodiment according to the present invention.
Figure 8B:
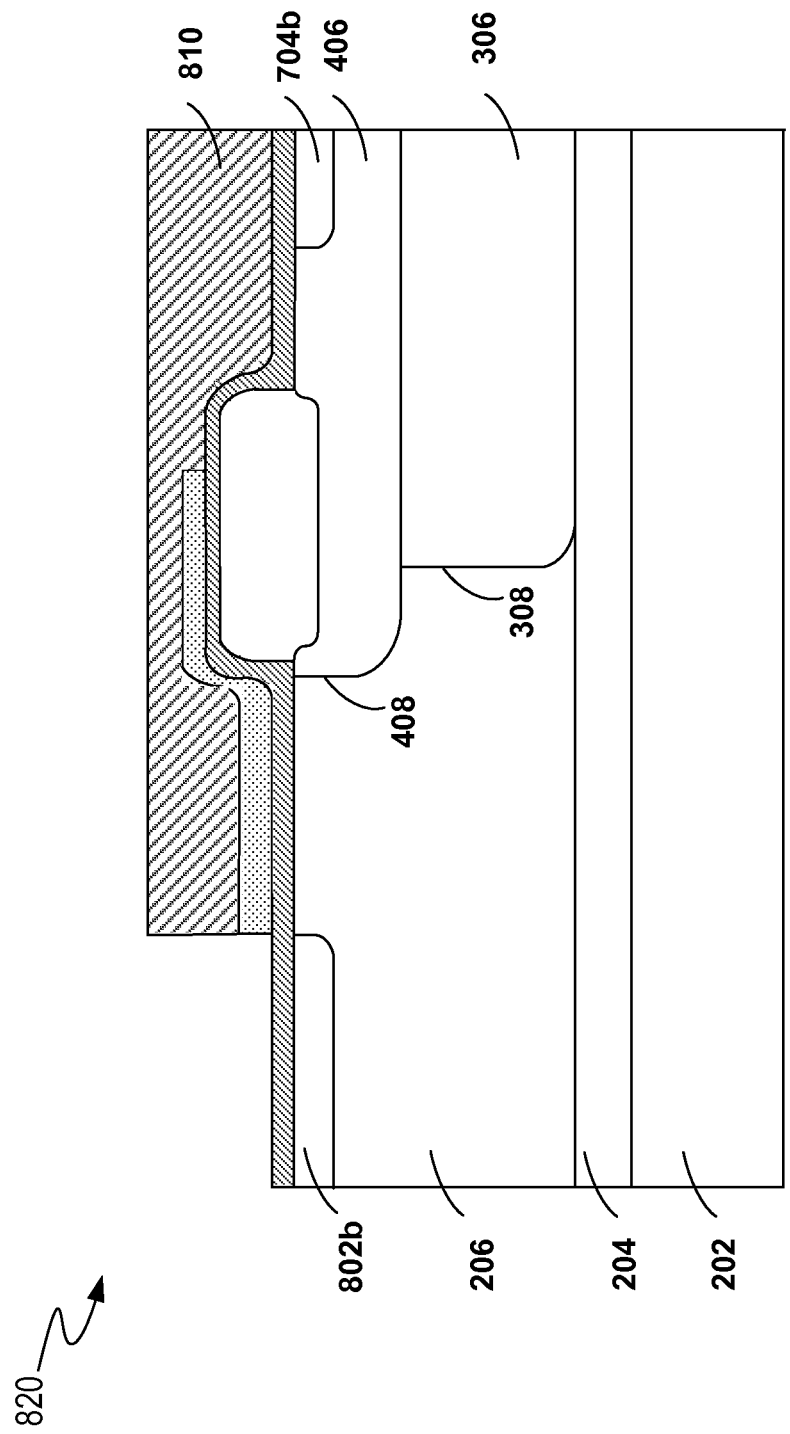
FIG. 8B and FIG. 8C show cross sections of a transistor body during a stage for fabricating an LDMOS transistor, in an embodiment according to the present invention.
Figure 8C:
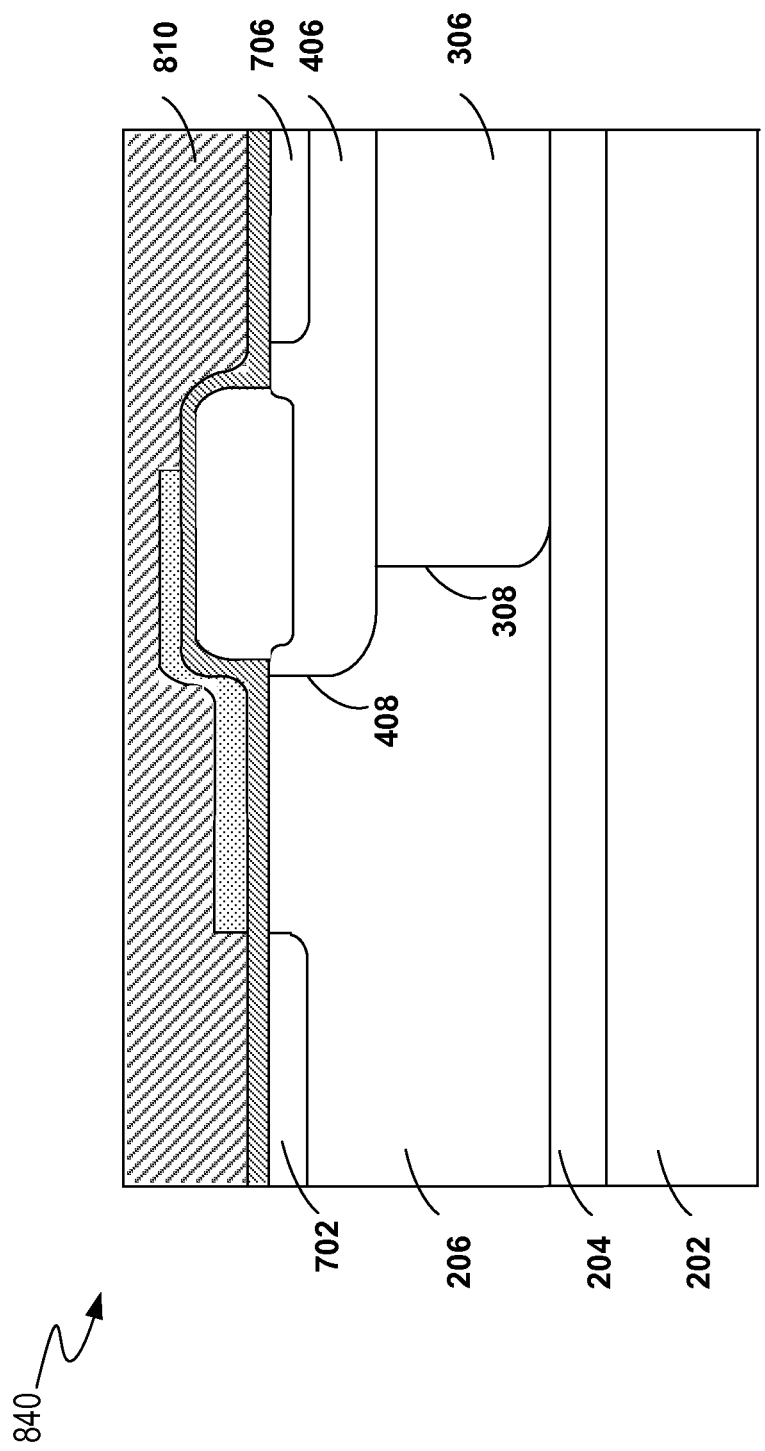
Figure 9A:
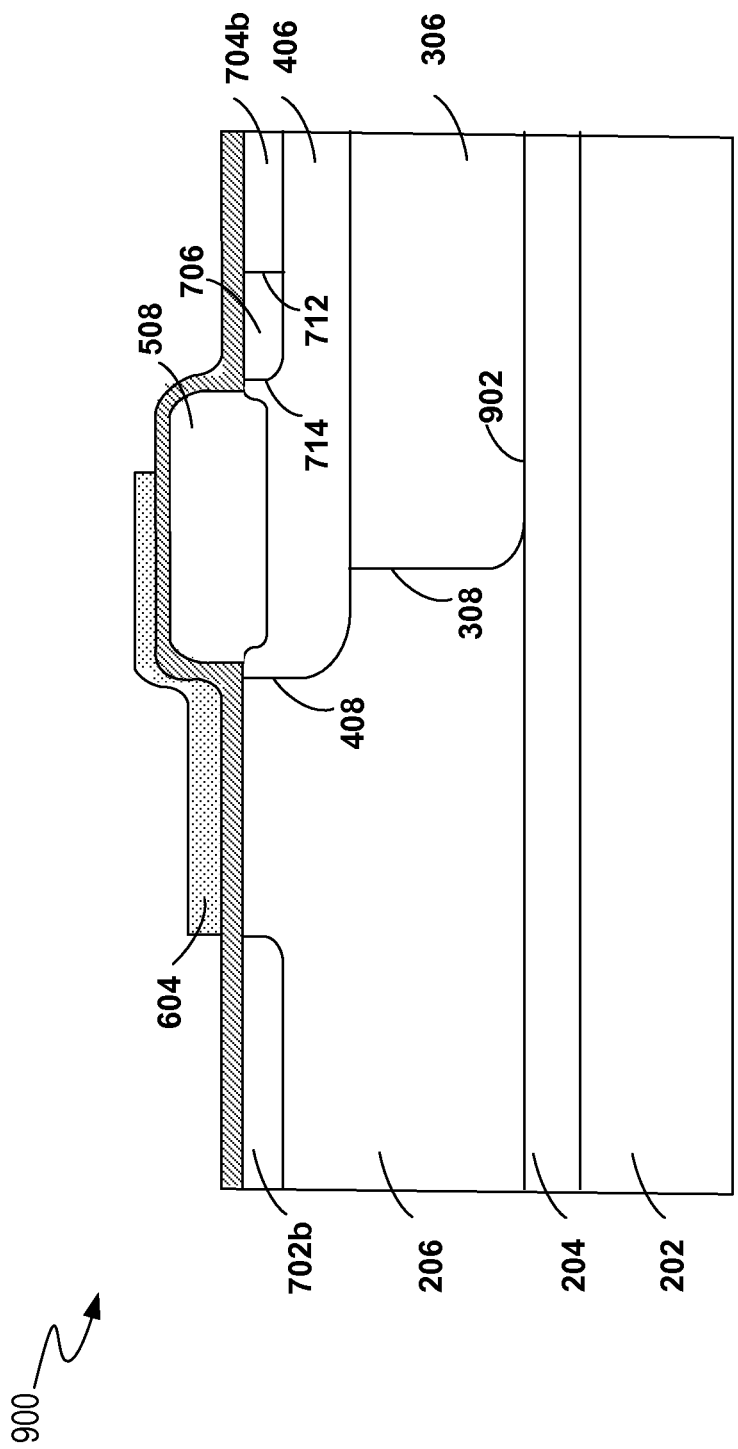
FIG. 9A illustrates a diagram of a cross section of an LDMOS transistor, in an embodiment according to the present invention.

FIG. 2 to FIG. 8C illustrate various stages of processes for fabricating an LDMOS transistor, e.g., the LDMOS transistor 900 in FIG. 9A, in an embodiment according to the present invention. Elements labeled the same in FIG. 2-FIG. 8C have similar functions. As understood by a person skilled in the art, the method for fabricating an LDMOS transistor can be implemented by other processes or technologies, and is not limited to the example illustrated in FIG. 2 to FIG. 8C.

Figure 2:
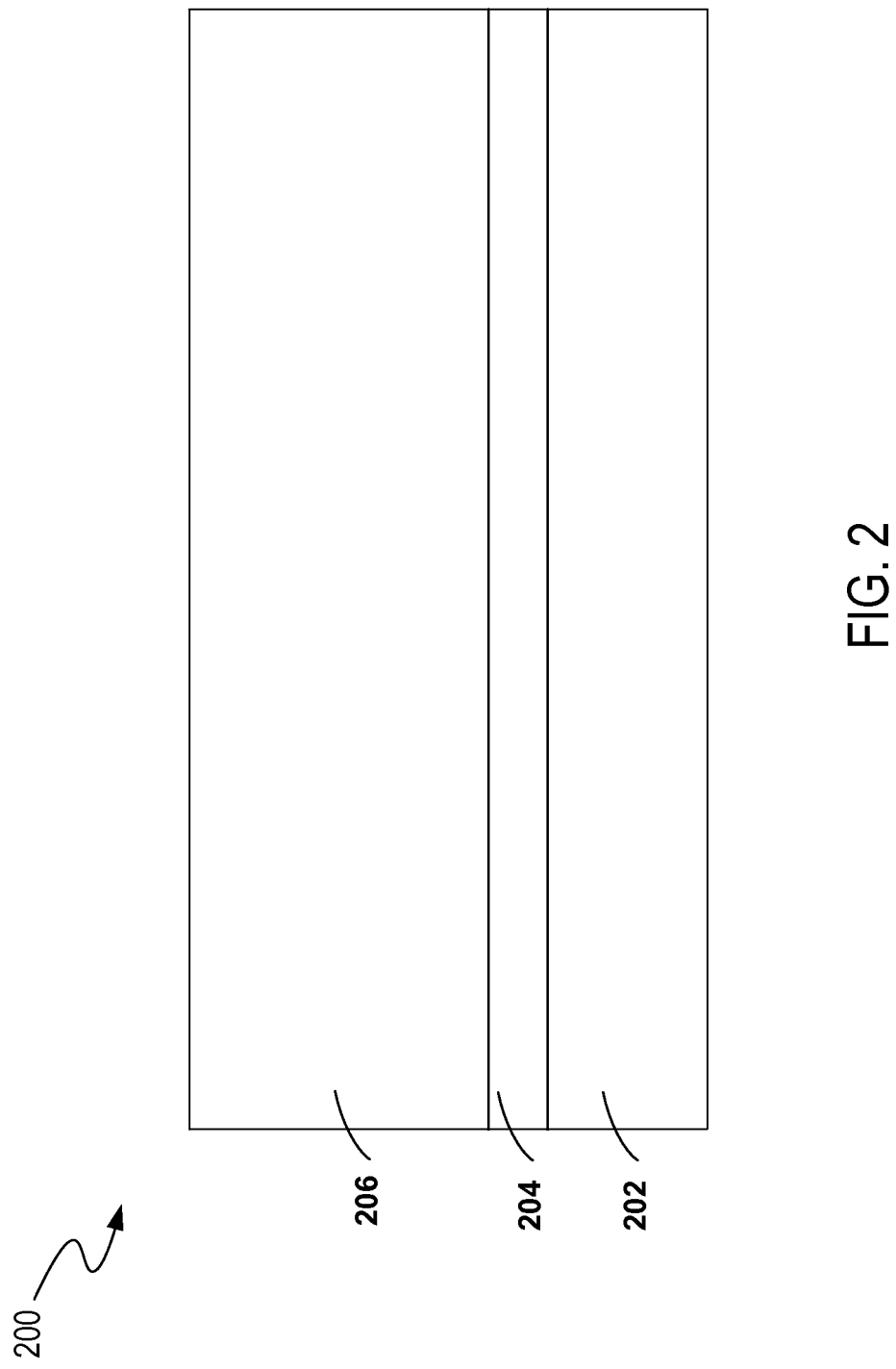
FIGS. 2, 3, 4, 5A, 5B, 6A, and 6B illustrate cross sections during stages for fabricating an LDMOS transistor, in an embodiment according to the present invention.

FIG. 2 illustrates a cross section 200 of a transistor body during an initial stage for fabricating the LDMOS transistor, in an embodiment according to the present invention. FIG. 2 shows how to form a buried layer 204 and a well 206 on a substrate 202. The substrate 202 has a first conductivity type, the buried layer 204 has a second conductivity type, and the well 206 has the first conductivity type. As described in the following disclosure, a P type is described as the first conductivity type, and an N type is described as the second conductivity type. However, this invention is not so limited; "a first conductivity type" can be an N type, and "a second conductivity type" can be a P type, in an alternative embodiment.

The substrate 202 is a thin slice of material such as silicon, silicon dioxide, aluminum oxide, sapphire, germanium, gallium arsenide (GaAs), an alloy of silicon, or germanium. To form the buried layer 204, an oxide layer (not shown) is deposited on the substrate 202. A nitride layer (not shown) is deposited on the oxide layer. In one embodiment, the nitride layer is patterned and etched using a mask to expose an area at the surface of the substrate 202, and an N-type dopant, e.g., phosphorus, is implanted into the exposed area of the substrate 202. A drive-in mechanism is used to diffuse the implanted N-type dopant to a desired depth to form the buried layer 204. Afterwards, the oxide layer and the nitride layer are removed, e.g., by etching. Subsequently, a P-type well 206 is formed on the buried layer 204, e.g., by a process of epitaxial growth. In one embodiment, the substrate 202 has a dopant density of approximately $2E15$ $cm^{-3}$. The buried layer 204 has a dopant density of approximately $1E18$ $cm^{-3}$. The well 206 has a dopant density of approximately $2E16$ $cm^{-3}$.

Figure 3:
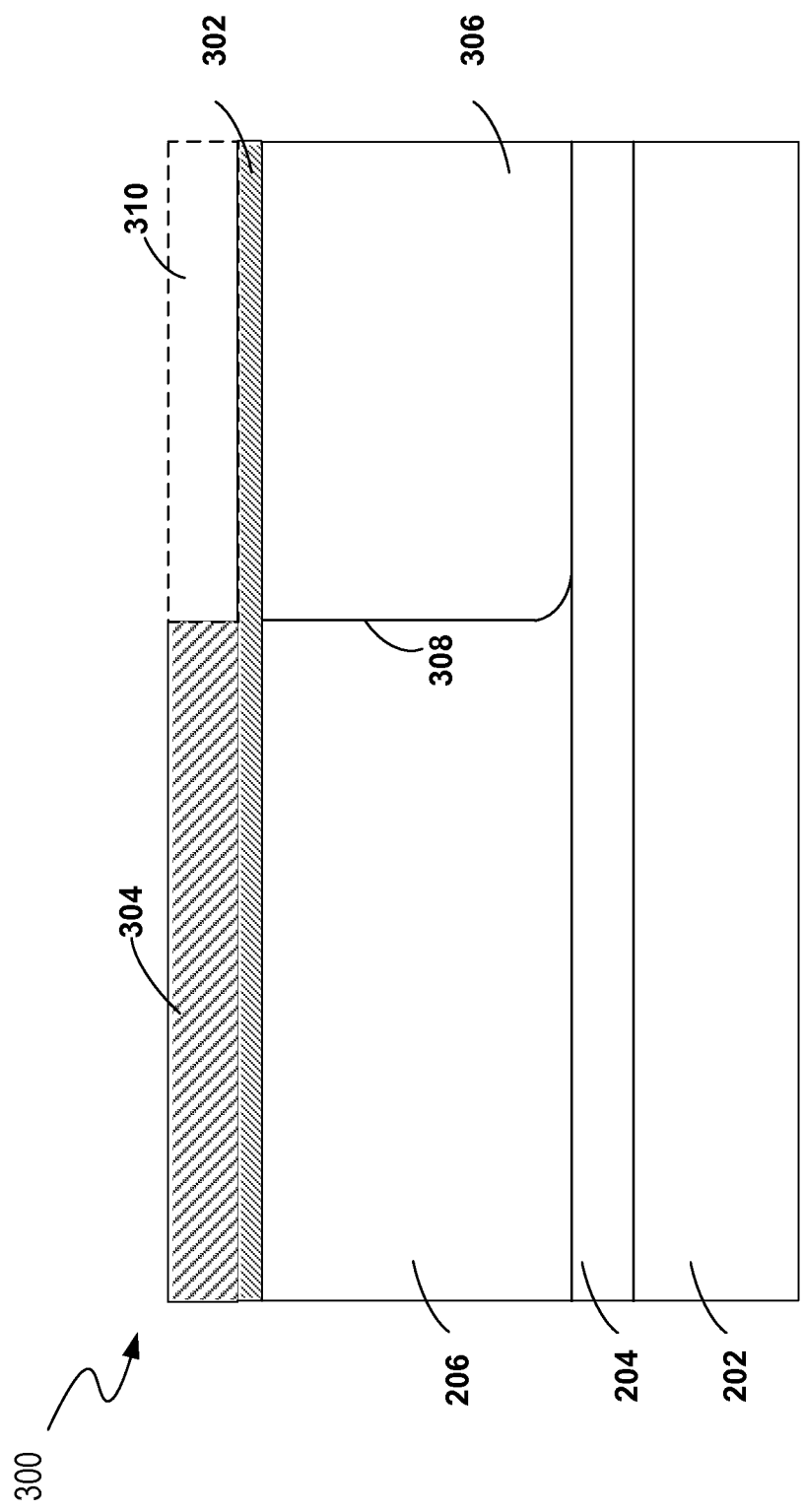

FIG. 3 illustrates a cross section 300 of a transistor body during a stage for fabricating the LDMOS transistor subsequent to the stage shown in FIG. 2, in an embodiment according to the present invention. FIG. 3 shows how to fabricate a well 306.

In one embodiment, an oxide layer 302 is deposited on the surface of the well 206. A photoresist layer 304 is deposited on the oxide layer 302 and patterned and etched using a mask to expose area 310 at the surface of the well 206. An N-type dopant, e.g., phosphorus, is implanted into the well 206 through the exposed area 310 to form a deep N-type well 306. Then, a drive-in mechanism is used to diffuse the implanted N-type dopant, such that the bottom frontier of the well 306 reaches the frontier of the buried layer 204. A frontier 308 between the N-type well 306 and the P-type well 206 is aligned to an edge of the exposed area 310. Consequently, the buried layer 204 and the N-type well 306 separate the P-type well 206 from other P-type regions. The photoresist layer 304 is removed by etching after the well 306 is formed. In one embodiment, the well 306 has a dopant density of approximately $3E16$ $cm^{-3}$.

Figure 4:
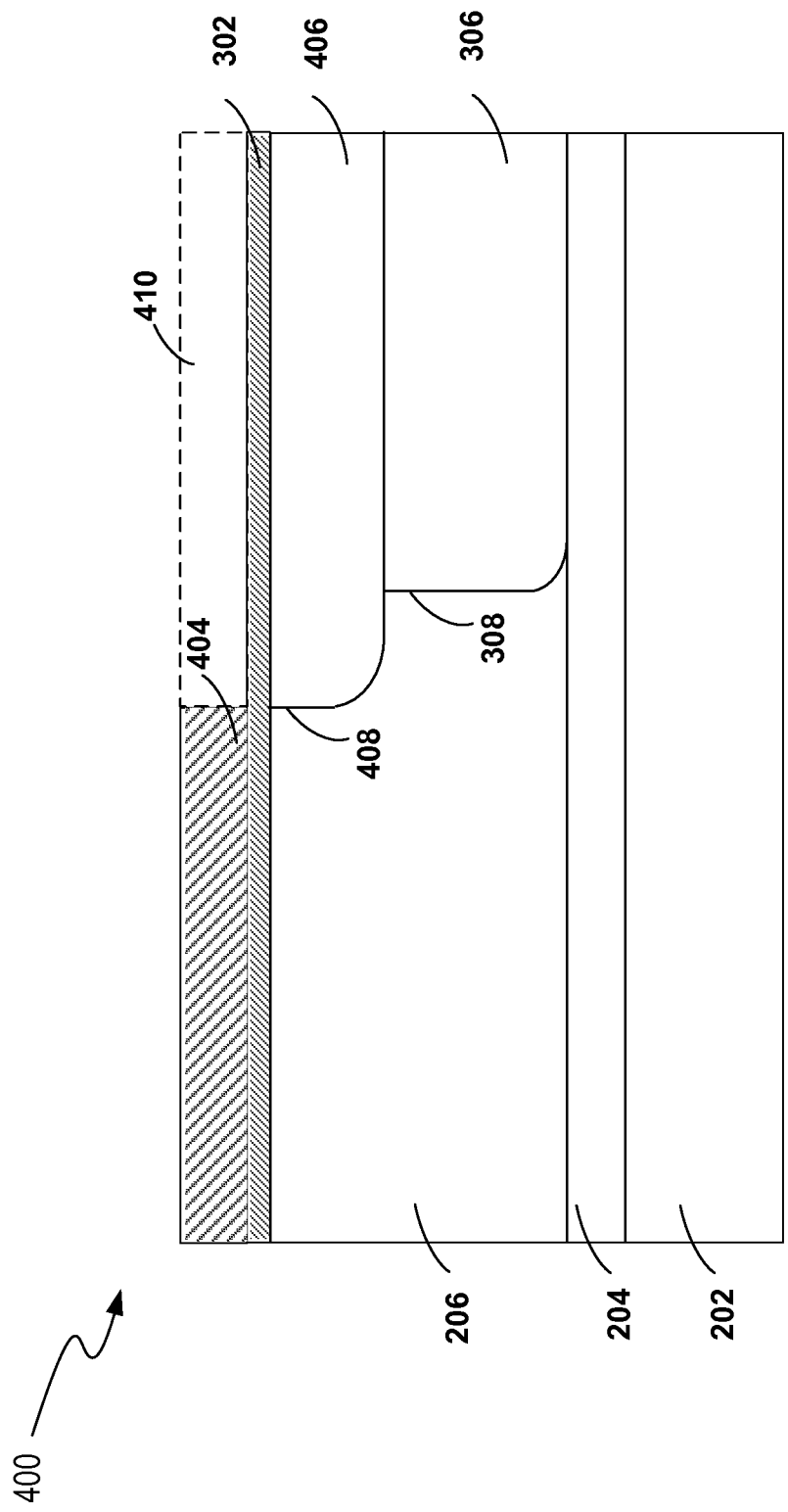

FIG. 4 illustrates a cross section 400 of a transistor body during a stage for fabricating the LDMOS transistor subsequent to the stage shown in FIG. 3, in an embodiment according to the present invention. FIG. 4 shows how to fabricate a shallow drift region 406.

More specifically, a photoresist layer 404 is deposited on the oxide layer 302. The photoresist layer 404 is patterned and etched according to a mask to expose area 410. An N-type dopant, e.g., phosphorus, is implanted into the well 306 and the well 206 through the exposed area 410. A drive-in mechanism is used to diffuse the implanted N-type dopants to a depth which is shallower than that of the well 306. Thus, the shallow drift region 406 is formed above the well 306, and a frontier 408 between the N-type shallow drift region 406 and the P-type well 206 is aligned to an edge of the exposed area 410. The photoresist layer 404 is removed by etching after the shallow drift region 406 is formed. In one embodiment, the shallow drift region 406 has a dopant density of approximately $6E16$ $cm^{-3}$.

Figure 5A:
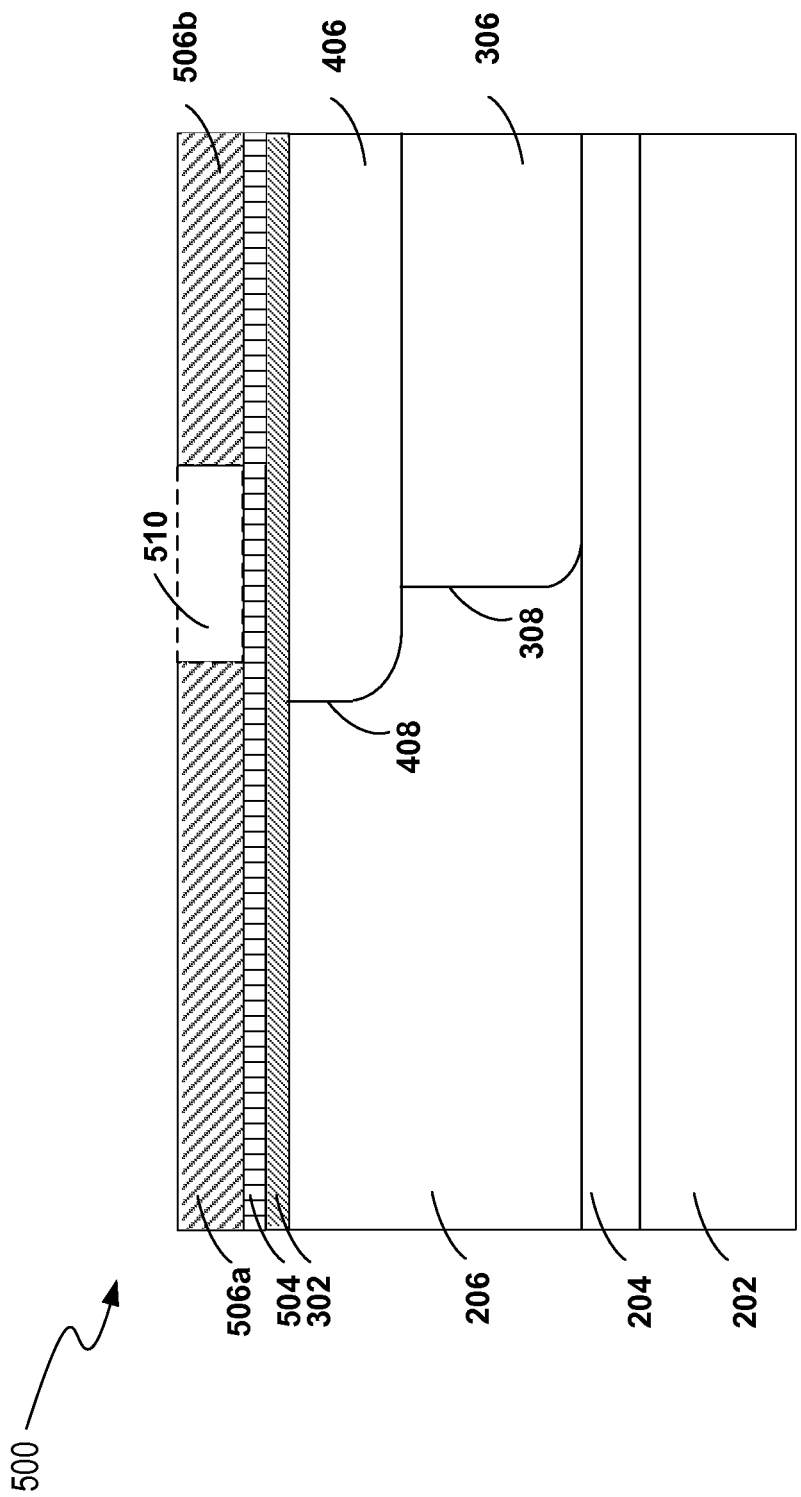
Figure 5B:
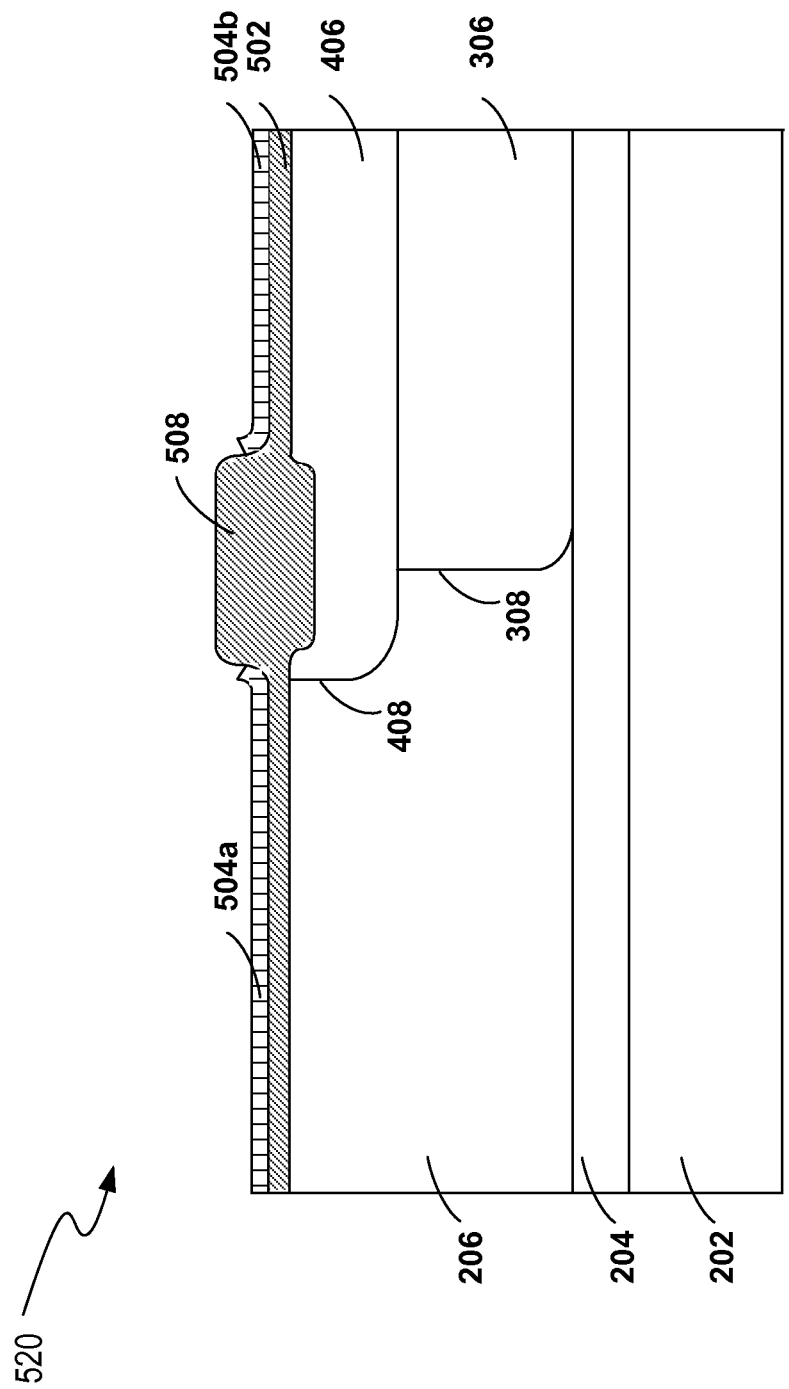

FIG. 5A and FIG. 5B illustrate cross sections 500 and 520 of a transistor body during a stage for fabricating the LDMOS transistor subsequent to the stage shown in FIG. 4, in an embodiment according to the present invention. FIG. 5A and FIG. 5B show how to fabricate a thick oxide 508.

As shown in FIG. 5A, a nitride layer 504 is deposited on the oxide layer 302. A photoresist layer is deposited on the nitride layer 504, and patterned and etched according to another mask to expose an area 510 above the surface of nitride layer 504. As a result, portions 506a and 506b of the photoresist layer remain and are aligned to edges of the exposed area 510. Subsequently, a portion of the nitride layer 504 exposed below the exposed area 510 is etched according to the mask of remaining photoresist layers 506a and 506b. Afterwards, the photoresist layers 506a and 506b are removed. As shown in FIG. 5B, the thick oxide 508 is grown at the exposed area 510 by a process of the local oxidation of silicon (LOCOS). The remaining portions of the nitride layer 504 and the oxide layer 302 are removed by etching after the thick oxide 508 is formed.

Figure 6A:
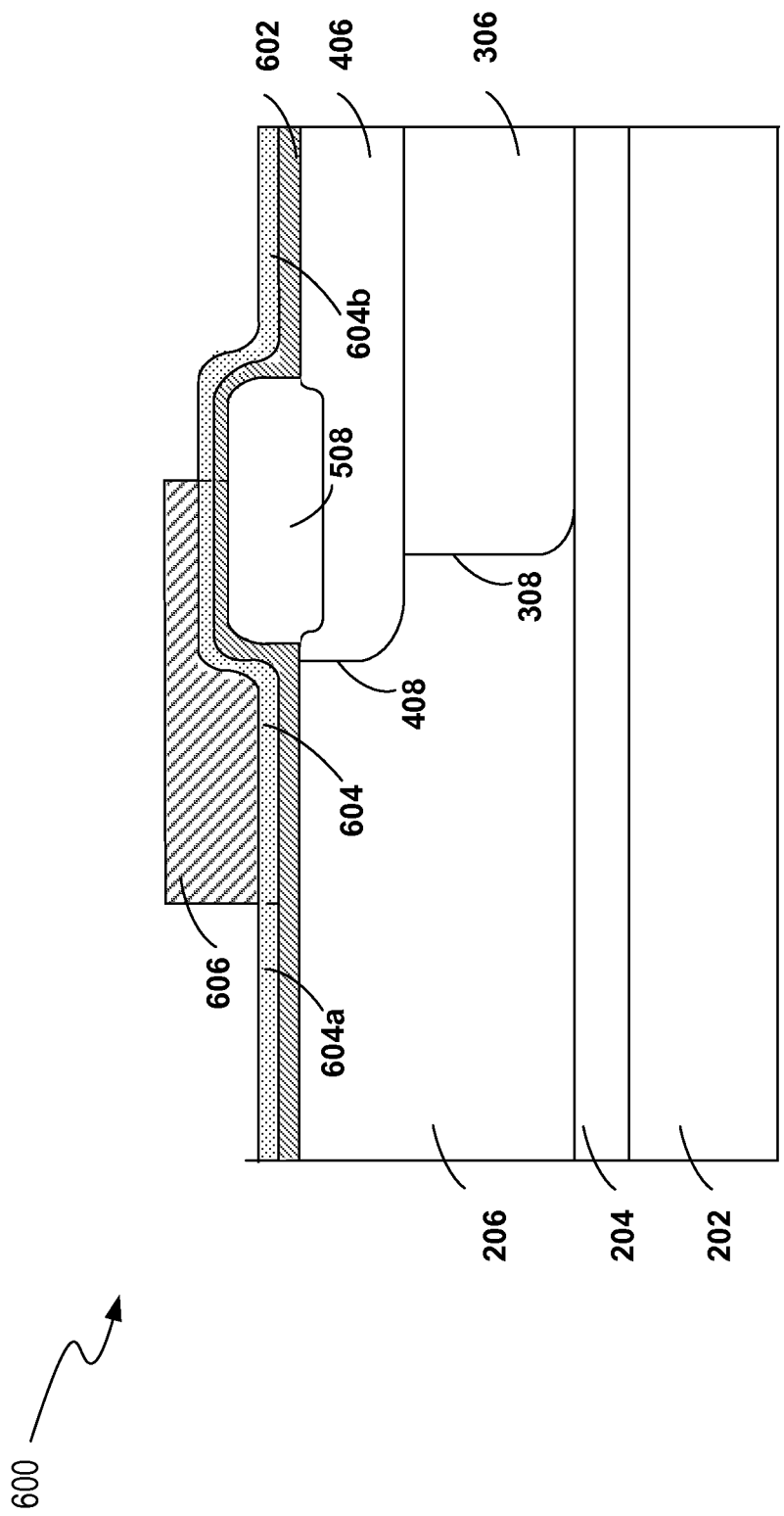
Figure 6B:
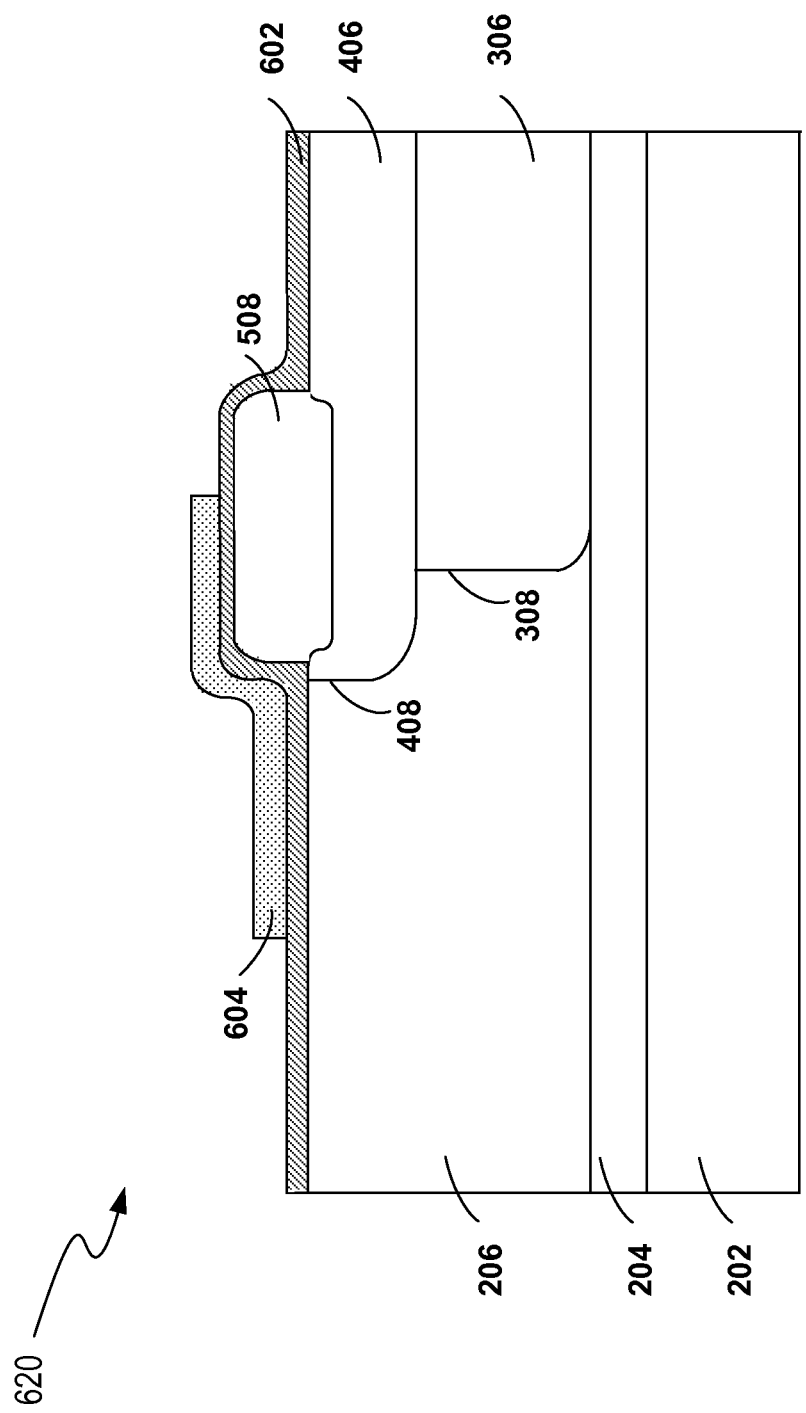

FIG. 6A and FIG. 6B illustrate cross sections 600 and 620 of a transistor body during a stage for fabricating the LDMOS transistor subsequent to the stage shown in FIG. 5A and FIG. 5B, in an embodiment according to the present invention. FIG. 6A and FIG. 6B show how to fabricate a gate 604.

In one embodiment, a new oxide layer 602 is grown on the surface of the LDMOS transistor body. For example, the oxide layer 602 covers the surface of the well 206, the thick oxide 508, and the shallow drift region 406. As shown in FIG. 6A, the gate 604 is deposited on the oxide layer 602. In one embodiment, the gate 604 includes a dielectric layer such as silicon oxide or nitride, and a conductive layer such as polysilicon or another metal material. A photoresist layer 606 is deposited on the gate 604, and is patterned and etched according to a mask to expose portions 604a and 604b of the gate 604. As shown in FIG. 6B, portions 604a and 604b of the gate 604 are etched, and the photoresist layer 606 is removed after the gate 604 is formed.

FIG. 7A to FIG. 7C illustrate how to fabricate a source 702, a drain 704, and a concentrator 706 during a stage for fabricating the LDMOS transistor subsequent to the stage shown in FIG. 6A and FIG. 6B, in an embodiment according to the present invention. FIG. 7A shows an example of a mask 700 used for forming the source 702, the drain 704, and the concentrator 706. FIG. 7B shows a cross section 720 of the LDMOS transistor along the line A-A' shown in FIG. 7A. FIG. 7C shows a cross section 740 of the LDMOS transistor along the line B-B' shown in FIG. 7A.

In one embodiment, an oxide layer and a photoresist layer (not shown) are deposited on the oxide layer 602, the gate 604, and the thick oxide layer 508, and are patterned and etched according to the mask 700. As such, a region of the transistor body corresponding to a region 710 of the mask 700 is blocked and the remaining regions of the transistor body are exposed. N-type impurities such as phosphorus are implanted into the exposed regions of the transistor, such that a highly doped N-type source 702, a highly doped N-type drain 704, and an N-type concentrator 706 are fabricated.

As shown in FIG. 7A, the drain 704 includes a pair of drain regions 704a and 704b. The drain regions 704a and 704b are substantially symmetric relative to a central line B-B'. Moreover, the concentrator 706 can be an N-type island separated from the drain regions 704a and 704b, in one embodiment. Alternately, the concentrator 706 can include more than one N-type separate islands. The distance L1 between the concentrator 706 and the source 702 is less than the distance L2 between the drain regions 704a and 704b to the source 702. Furthermore, there are gaps between the concentrator 706 and the drain regions 704a and 704b, which form a pair of windows 708a and 708b.

As shown in FIG. 7B and FIG. 7C, the source 702 is deposited in the well 206. The drain 704 and the concentrator 706 are deposited in the shallow drift region 406. In one embodiment, each of the source 702, the drain 704, and the concentrator 706 has a dopant density of approximately 3E20 $cm^{-3}$, which is heavier than the dopant density of the shallow drift region 406. In one embodiment, the lateral distance L3 between the frontier 308 of the well 306 and the frontier 714 of the concentrator 706 is less than the lateral distance L4 between the frontier 408 of the shallow drift region 406 and the frontier 714. The photoresist layer is removed after the source 702, the drain 704 and the concentrator 706 are formed.

FIG. 8A to FIG. 8C illustrate how to fabricate a substrate contact 802 during a stage for fabricating the LDMOS transistor subsequent to the stage shown in FIG. 7A to FIG. 7C, in an embodiment according to the present invention. FIG. 8A shows an example of a mask 800 for fabricating the substrate contact 802. FIG. 8B shows a cross section 820 of the transistor body along the line C-C' shown in FIG. 8A. FIG. 8C shows a cross section 840 of the transistor body along the line D-D' shown in FIG. 8A.

In one embodiment, a photoresist layer (not shown) is deposited on the oxide layer and patterned and etched according to the mask 800. Thus, a region 810 of the transistor body is blocked and the remaining regions, e.g., regions 802a and 802b, are exposed. P-type impurities, such as boron, are implanted to form a highly doped P-type substrate contact 802. As shown in the example of FIG. 8B and FIG. 8C, the substrate contact 802 is deposited in the well 206, and includes a pair of substrate contact regions 802a and 802b. In one embodiment, the substrate contact regions 802a and 802b are substantially symmetric relative to the central line D-D'. In one embodiment, the substrate contact 802 has a dopant density of approximately 1E20 $cm^{-3}$. After the substrate contact regions 802a and 802b are formed, the photoresist layer and the oxide layer are removed.

Figure 9B:
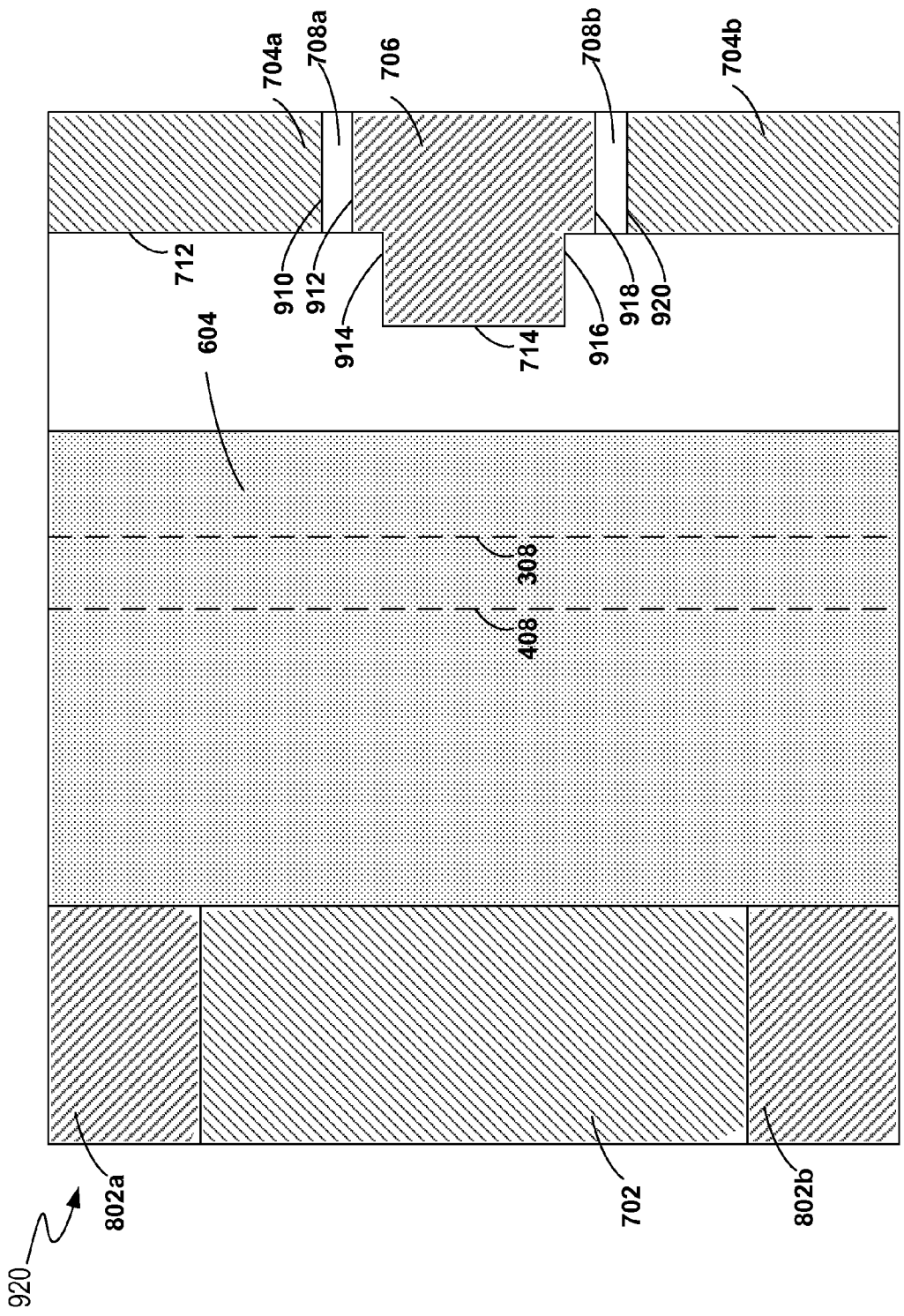
FIG. 9B illustrates a layout diagram of an LDMOS transistor, in an embodiment according to the present invention.

FIG. 9A illustrates a cross section of an LDMOS transistor 900, in an embodiment according to the present invention. The LDMOS transistor 900 can be fabricated according to the method shown in FIG. 2 to FIG. 8C. FIG. 9B illustrates a layout diagram 920 of the LDMOS transistor 900, in an embodiment according to the present invention. Elements labeled the same as in FIG. 2 to FIG. 8C have similar functions. FIG. 9A and FIG. 9B are described in relation to FIG. 2 to FIG. 8C.

In one embodiment, the LDMOS transistor 900 includes a P-type substrate 202, an N-type buried layer 204, a P-type well 206, an N-type deep well 306, an N-type shallow drift region 406, a thick oxide 508, a gate 604, an N-type source 702, an N-type drain 704, and an N-type concentrator 706. The source 702 is formed in the well 206. The shallow drift region 406 is formed in the well 206 and separated from the source 702. The drain 704 and the concentrator 706 are formed in the shallow drift region 406. In one embodiment, the concentrator 706 includes an N-type island and is separated from the other N-type regions in the shallow drift region 406, e.g., the concentrator 706 is separated from the drain 704. The distance L1 between the concentrator 706 and the source 702 is less than the distance L2 between the drain 704 and the source 702.

The well 306 is formed in the well 206 and below the shallow drift region 406. A frontier 902 of the well 306 extends to the buried layer 204, such that the buried layer 204 and the well 306 separate the well 206 from other P-type regions. In one embodiment, the lateral distance L3 between the frontier 308 of the well 306 and the frontier 714 of the concentrator 706 is less than the lateral distance L4 between the frontier 408 of the shallow drift region 406 and the frontier 714.

As shown in FIG. 9B, the drain 704 includes a pair of drain regions 704a and 704b. The concentrator 706 is formed between the drain regions 704a and 704b. As will be discussed in relation to FIG. 13, one or more windows 708a and 708b in the shallow drift region 406 and between the concentrator 706 and the drain 704 constitute resistors coupled between the concentrator 706 and the drain 704.

Figure 10:
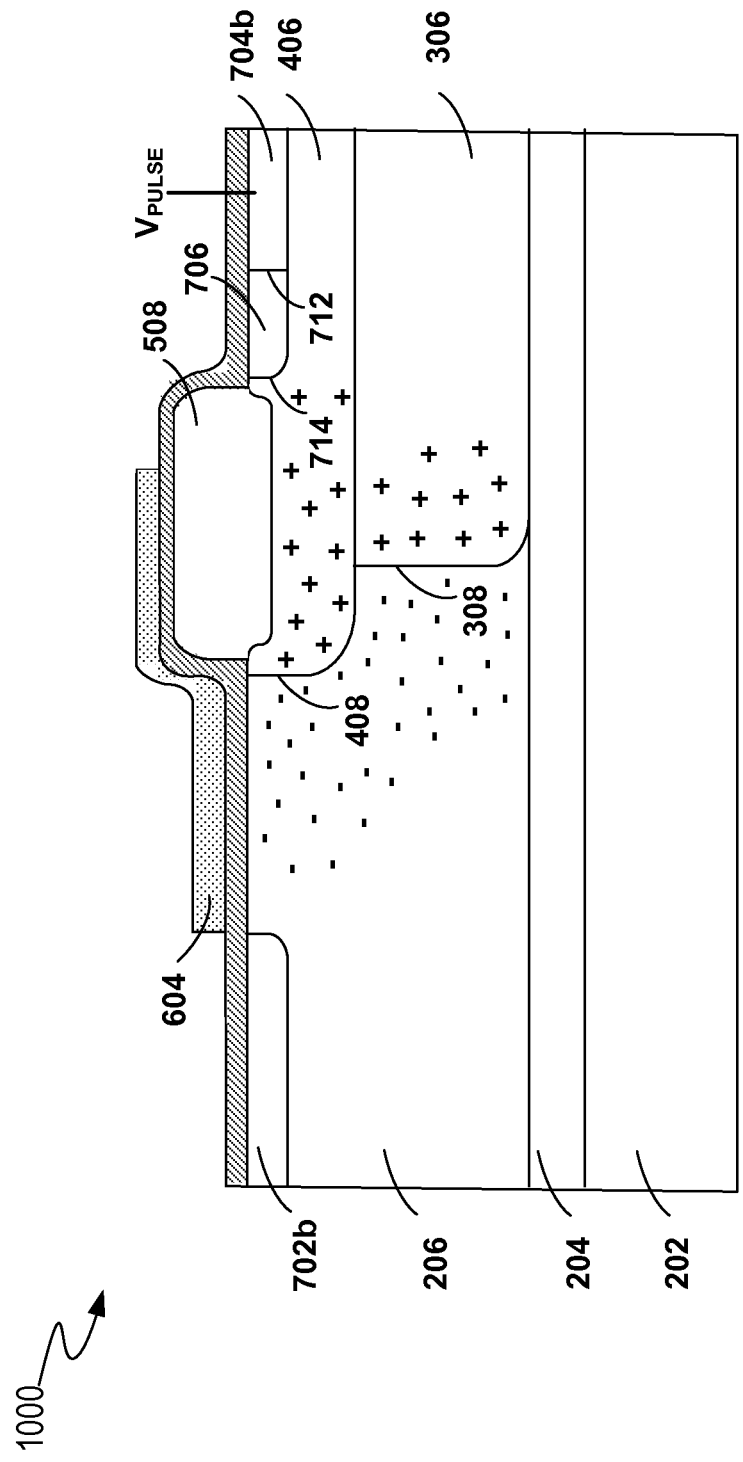
FIG. 10 illustrates a diagram of a cross section of an LDMOS transistor, in an embodiment according to the present invention.

FIG. 10 illustrates a cross section 1000 of an LDMOS transistor, e.g., the LDMOS transistor 900 in FIG. 9A, in an embodiment of the present invention. Elements labeled the same as in FIG. 9A have similar functions. FIG. 10 is described in combination with FIG. 9A. In the example of FIG. 10, an ESD pulse $V_{PULSE}$ is applied to the drain 704.

In one embodiment, when an ESD pulse is applied to the drain regions 704a and 704b, the PN junctions formed by the P-type well 206 and the N-type shallow drift region 406, e.g., the PN junctions across the frontier 408, are reverse biased. Likewise, the PN junctions formed by the P-type well 206 and the N-type well 306, e.g., the PN junctions across the frontier 308, are reverse biased. Thus, holes in the well 206 and electrons in the shallow drift region 406 and well 306 are depleted. As shown in FIG. 10, negative ionic charges (represented as "−" in FIG. 10) emerge in a first region of the well 206 near the frontier 408 and the frontier 308. Positive ionic charges (represented as "+" in FIG. 10) emerge in a second region of the shallow drift region 406 near the frontier 408 and in a third region of the well 306 near the frontier 308. Thus, the positive ions and the negative ions constitute a depletion region across the frontier 408 and the frontier 308 (e.g., the depletion region includes the first region, the second region, and the third region). The positive ions and the negative ions establish a high electric field in the depletion region.

As discussed in relation to FIG. 9A, the distance L1 between the concentrator 706 and the source 702 is less than the distance L2 between the drain 704 and the source 702. As a result, the depletion region in the shallow drift region 406, e.g., the third region, cannot extend further than a plane to which the frontier 714 of the concentrator 706 belong. In other words, the depletion region at all depths of the shallow drift region 406 ends at the plane associated with the frontier 714, whether the dopant density is unevenly distributed or not.

Figure 11:
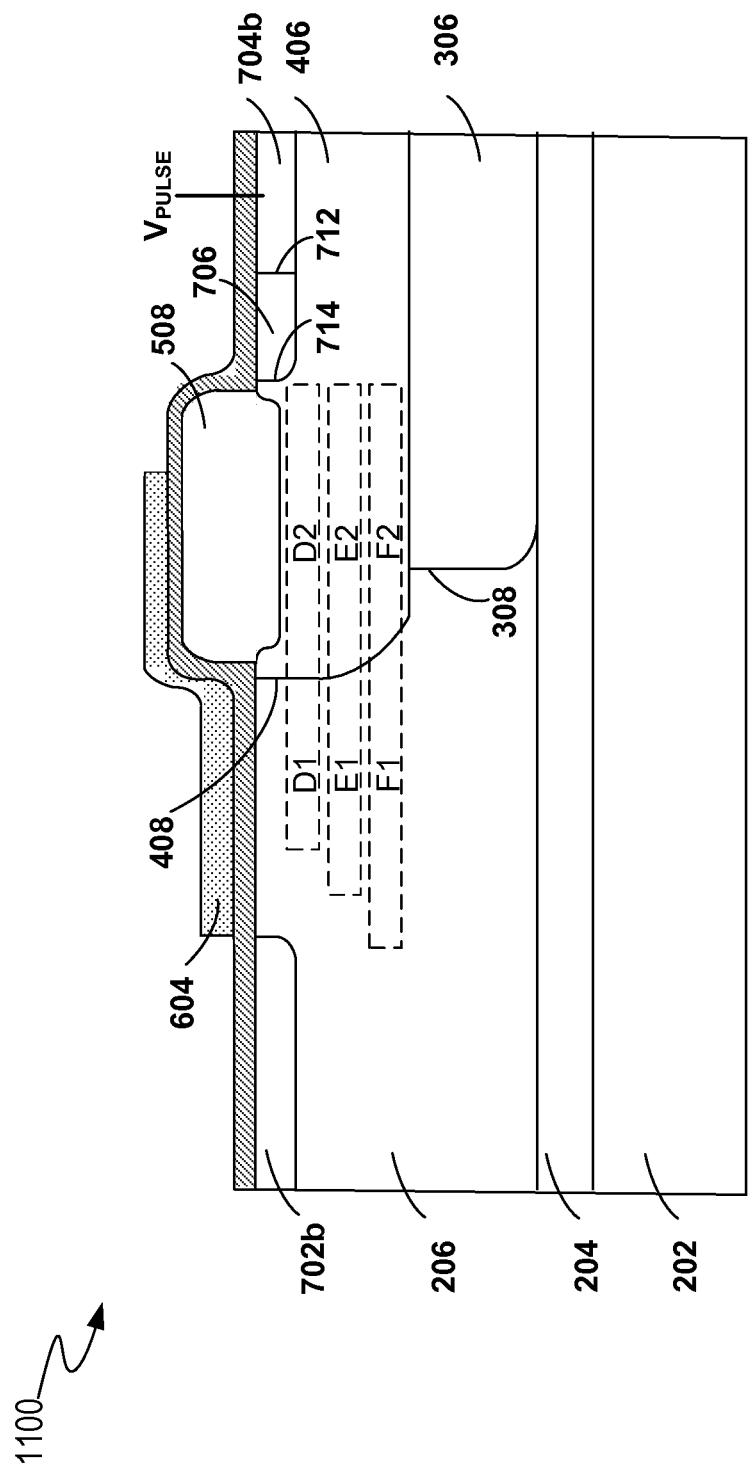
FIG. 11 illustrates another diagram of a cross section of an LDMOS transistor, in an embodiment according to the present invention.

FIG. 11 illustrates another diagram of a cross section 1100 of the LDMOS transistor 900, in an embodiment according to the present invention. FIG. 11 is described in combination with FIG. 9A and FIG. 10.

In the example of FIG. 11, the regions D1-D2, E1-E2, and F1-F2 form PN junctions across the frontier 408. The PN junctions D1-D2, E1-E2, and F1-F2 are at different depths at the frontier 408. By way of example, in the well 206, the dopant density of the P-type region D1 is greater than that of the region E1, which is greater than that of the region F1. Similarly, in the shallow drift region 406, the dopant density of the N-type region D2 is greater than that of the region E2, which is greater than that of the region F2. Since all the regions D2, E2, and F2 in the shallow drift region 406 extend to the plane associated with the frontier 714 of the concentrator 706, the depletion widths of the regions D1-D2, E1-E2, and F1-F2 in the shallow drift region 406 is clamped to a substantially same value $X_{CLIPPED}$.

Figure 12:
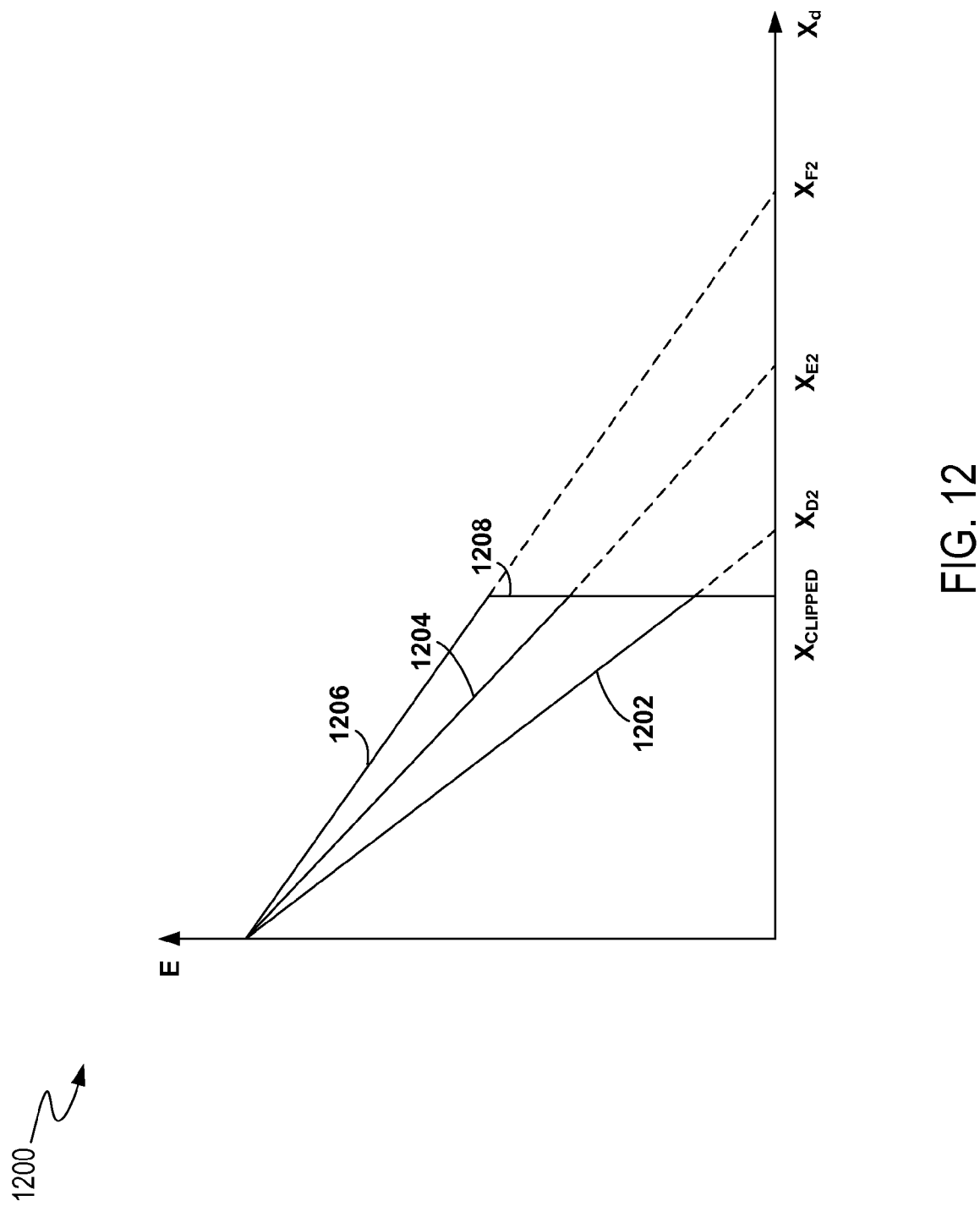
FIG. 12 shows a diagram illustrating electric fields in an LDMOS transistor, in an embodiment according to the present invention.

FIG. 12 shows a diagram 1200 illustrating electric fields in the LDMOS transistor 900, in an embodiment according to the present invention. FIG. 12 is described in combination with FIG. 11. The lines 1202, 1204, and 1206 represent the electric fields in the regions D2, E2, and F2, respectively.

Figure 1C:
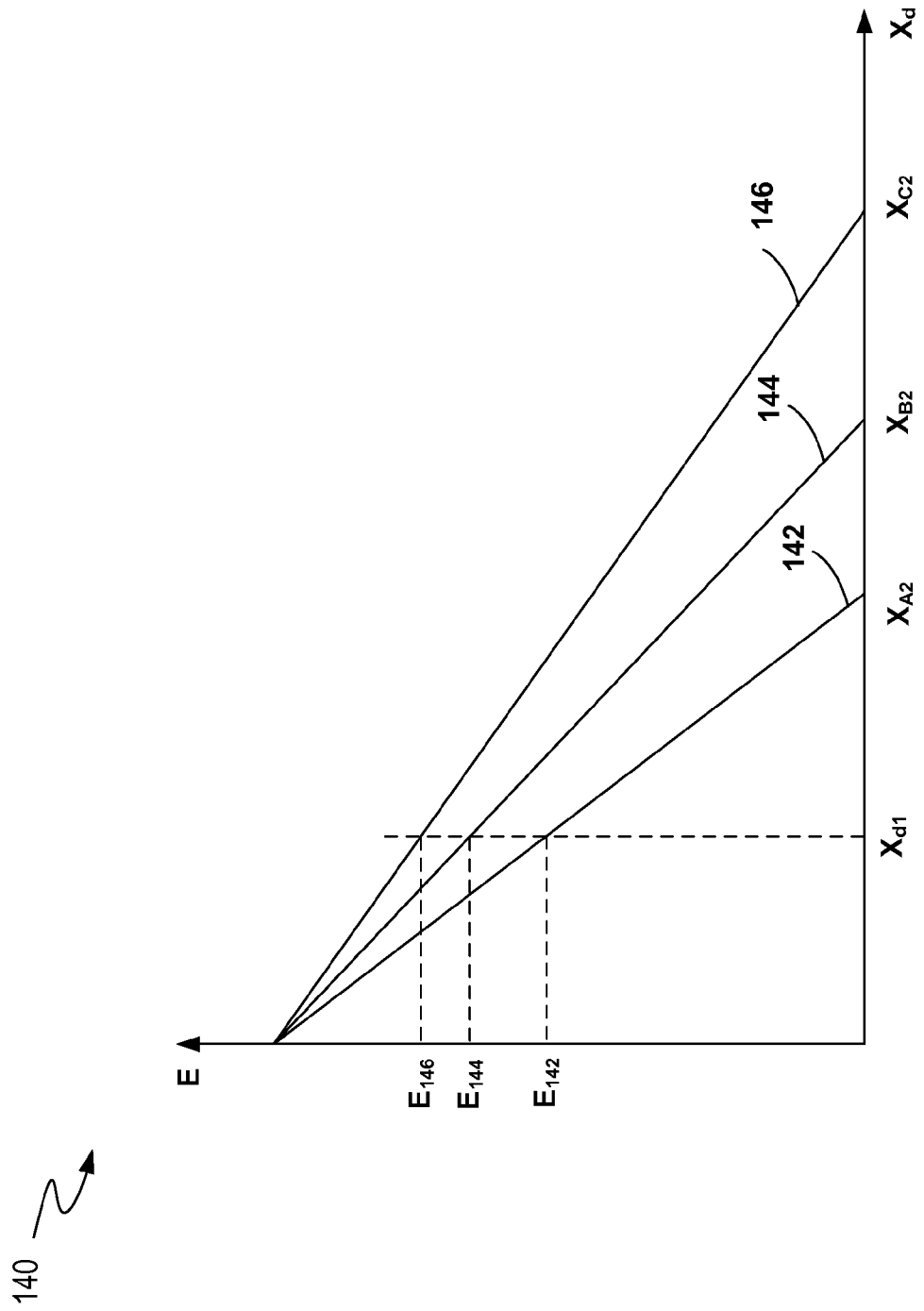
FIG. 1C shows a diagram illustrating electric fields in a conventional LDMOS transistor.
Figure 1D:
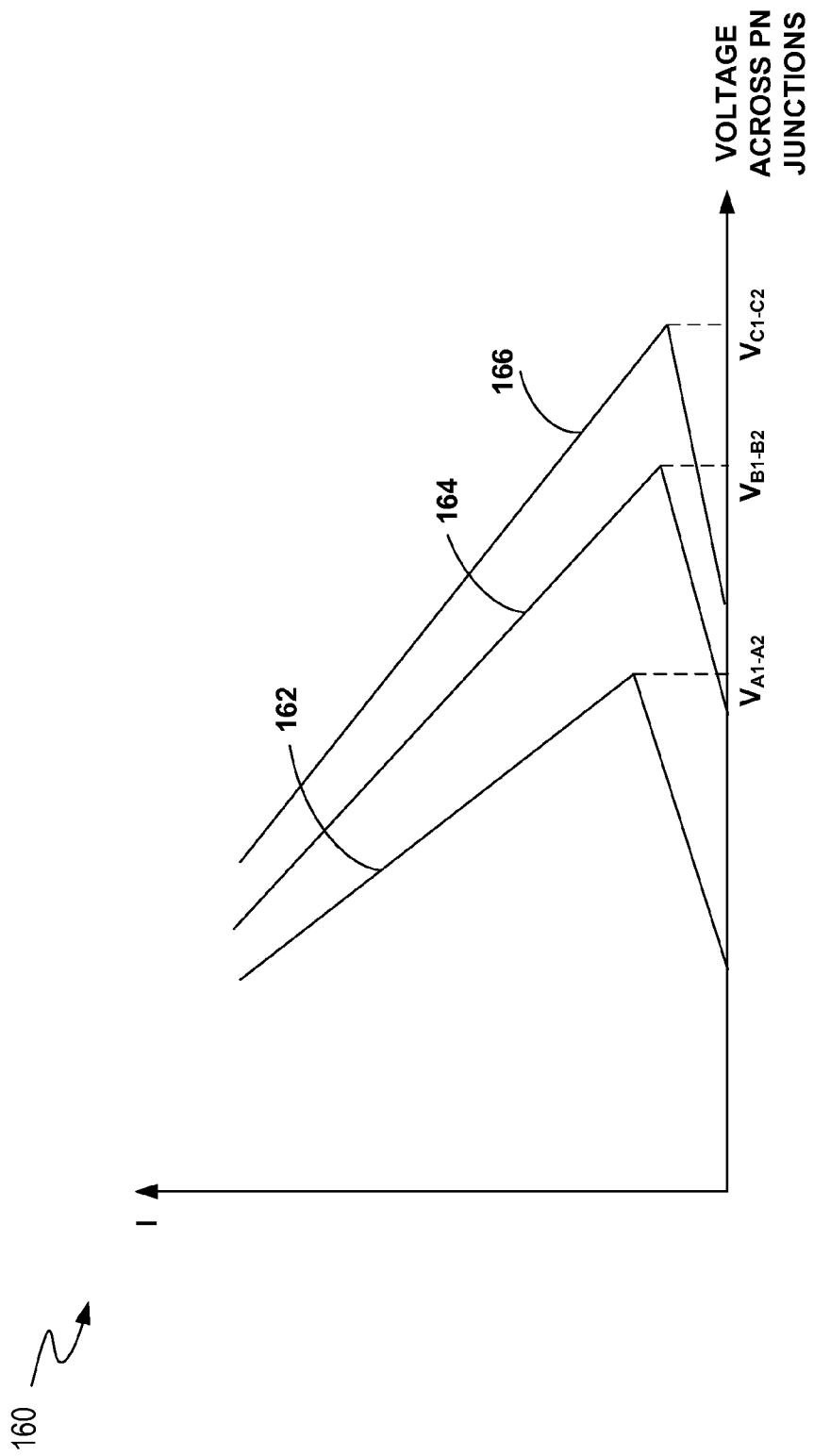
FIG. 1D illustrates a diagram of currents through PN junctions versus inverse voltages across the PN junctions in a conventional LDMOS transistor.

As shown in FIG. 12, the boundaries of the regions D2, E2, and F2 are all clamped to $X_{CLIPPED}$, rather than extending further to $X_{D2}$, $X_{E2}$, and $X_{F2}$, respectively. Therefore, a breakdown voltage of a PN junction D1-D2, E1-E2, or F1-F2 can be represented by a trapezoidal area enclosed by a corresponding line 1202, 1204, or 1206, axis Xd, axis E, and a vertical line 1208. Compared to the conventional LDMOS transistor 100, e.g., refer to FIG. 1C, differences between breakdown voltages of different PN junctions are further decreased.

Figure 13:
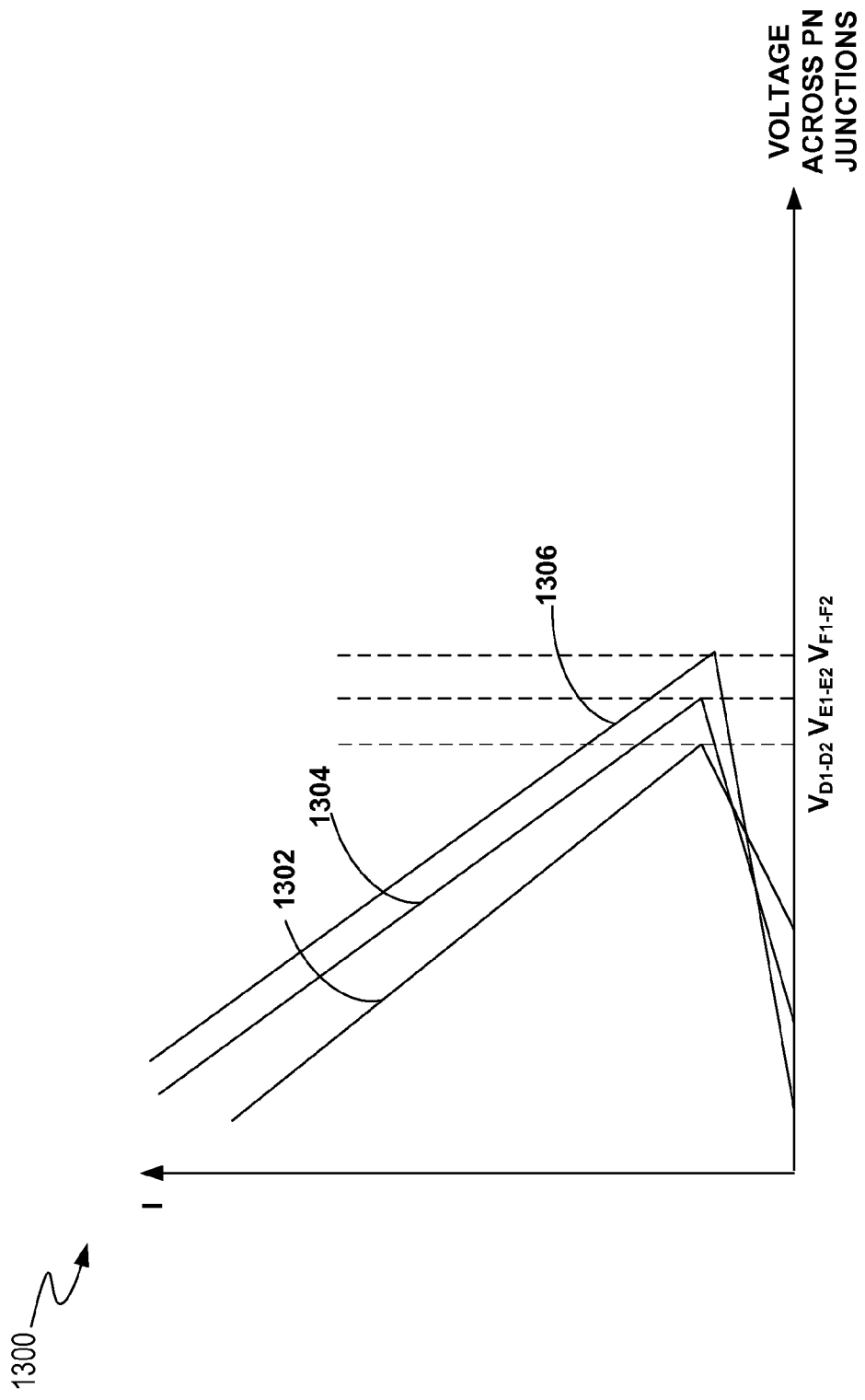
FIG. 13 illustrates a diagram of currents through PN junctions versus inverse voltages across the PN junctions in an LDMOS transistor, in an embodiment according to the present invention.

FIG. 13 illustrates a diagram 1300 of currents through PN junctions on the frontier 408 versus inverse voltages across the PN junctions, in an embodiment according to the present invention. FIG. 13 is described in combination with FIG. 12.

In the example of FIG. 13, the curves 1302, 1304, and 1306 represent the currents versus inverse voltages associated with the PN junctions D1-D2, E1-E2, and F1-F2, respectively. Take the curve 1302, for example. When an inverse voltage of the PN junction D1-D2 increases from zero volts to the breakdown voltage $V_{D1\text{-}D2}$, the current of the PN junction A1-A2 increases slightly from zero amperes. If the inverse voltage reaches the breakdown voltage $V_{D1\text{-}D2}$, then the PN junction D1-D2 is broken down. Then, the current of the PN junction D1-D2 increases because of the snap-back effect. The PN junctions E1-E2 and F1-F2 operate similarly as the PN junction D1-D2 with respect to their own breakdown voltages $V_{E1\text{-}E2}$ and $V_{F1\text{-}F2}$.

Since differences between the breakdown voltages $V_{E1\text{-}E2}$, $V_{F1\text{-}F2}$, and $V_{D1\text{-}D2}$ are relatively small, the PN junctions E1-E2 and F1-F2 can be broken down when the inverse voltage reaches the breakdown voltage $V_{D1\text{-}D2}$ and then goes up a little to reach $V_{E1\text{-}E2}$ and $V_{F1\text{-}F2}$. Therefore, the substrate currents also flow through the regions E1-E2 and F1-F2.

Advantageously, if a snap-back effect is triggered by an ESD pulse, then the energy can be released through multiple PN junctions. Thus, the breakdown current flowing through a single PN junction is reduced, which protects the LDMOS transistor 900 from being damaged. Therefore, the ESD performance of the LDMOS transistor 900 is enhanced, and the lifetime of the LDMOS transistor 900 is lengthened.

Furthermore, the windows 708a and 708b constitute a resistor coupled between the drain region 704a and the concentrator 706, and a resistor coupled between the drain region 704b and the concentrator 706. When an ESD pulse is applied, the substrate current flows through the resistors 708a and 708b, which causes an additional voltage drop across the resistors. Thus, the inverse voltages across PN junctions on the frontier 408 increase, which breaks down more PN junctions. For example, the PN junction E1-E2, having a higher breakdown voltage than that of the PN junction D1-D2, can be broken down because the windows 708a and 708b help increase the inverse voltage across the PN junction E1-E2. As such, more PN junctions conduct currents to release energy, which further improves the ESD performance.

Furthermore, the well 306 provides an additional current path for the flow of the electrons. For example, a current can flow through the drain 704, the shallow drift region 406, the well 306, the well 206, and the source 702. Thus, the current density across the frontier 408 is further reduced because some of the electrons flow through the frontier 308 of the well 306. Therefore, the ESD performance is further improved and the lifetime of the LDMOS transistor 900 is lengthened.

Figure 14:
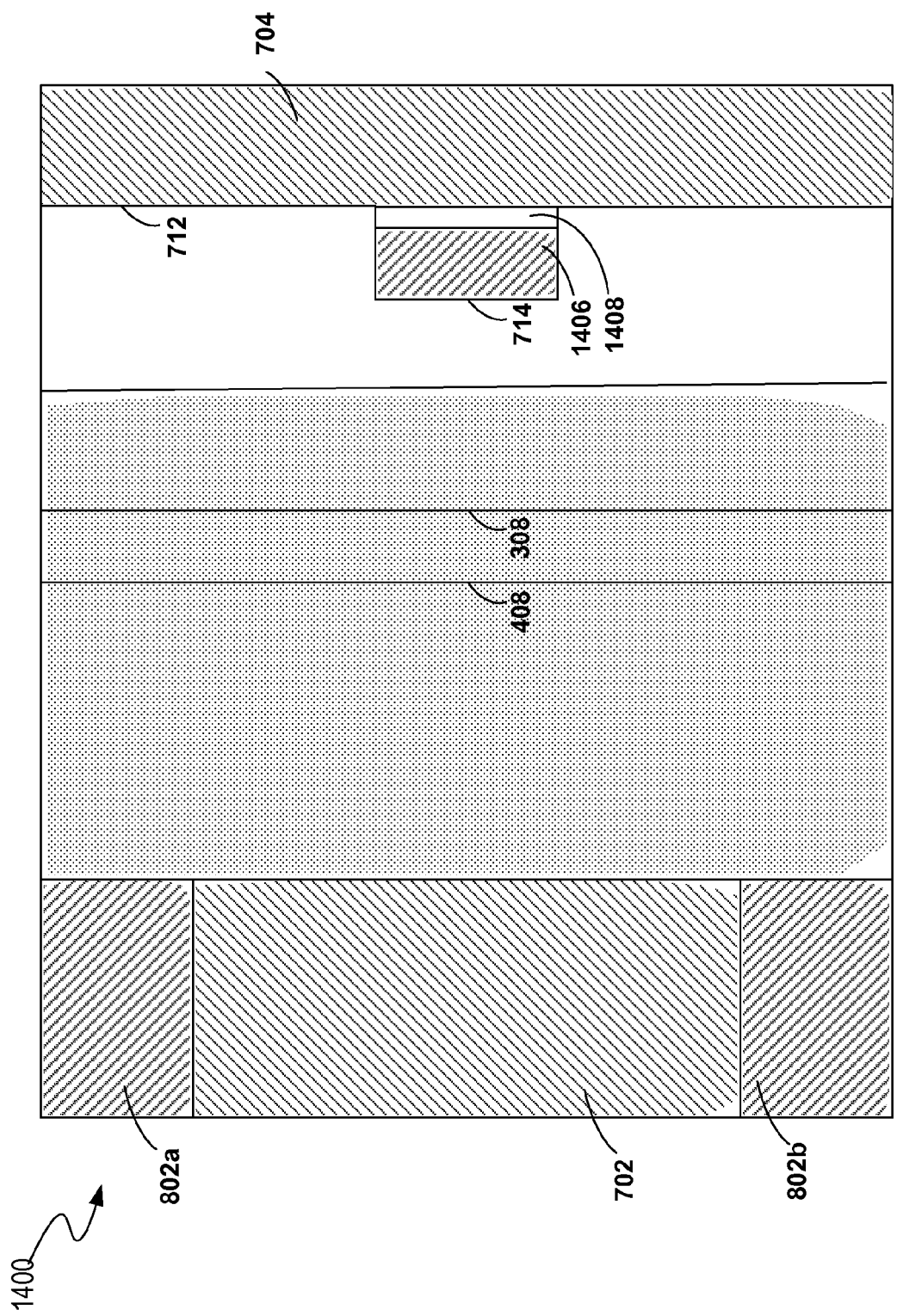
FIG. 14 illustrates another layout diagram of an LDMOS transistor, in an embodiment according to the present invention.

FIG. 14 illustrates another layout diagram 1400 of the LDMOS transistor 900, in an embodiment according to the present invention. Elements labeled the same as in FIG. 9B have similar functions. In the example of FIG. 14, the LDMOS transistor includes a concentrator 1406 in front of the drain 704 and operates similarly as corresponding components in FIG. 9B. In one embodiment, a window 1408 is formed between the concentrator 1406 and the drain 704. In one embodiment, the dopant density of the concentrator 1406 is the same with that of the concentrator 706. The LDMOS transistor 900 can have other layout designs, and is not limited to the example shown in FIG. 9B and FIG. 14.

Figure 15:
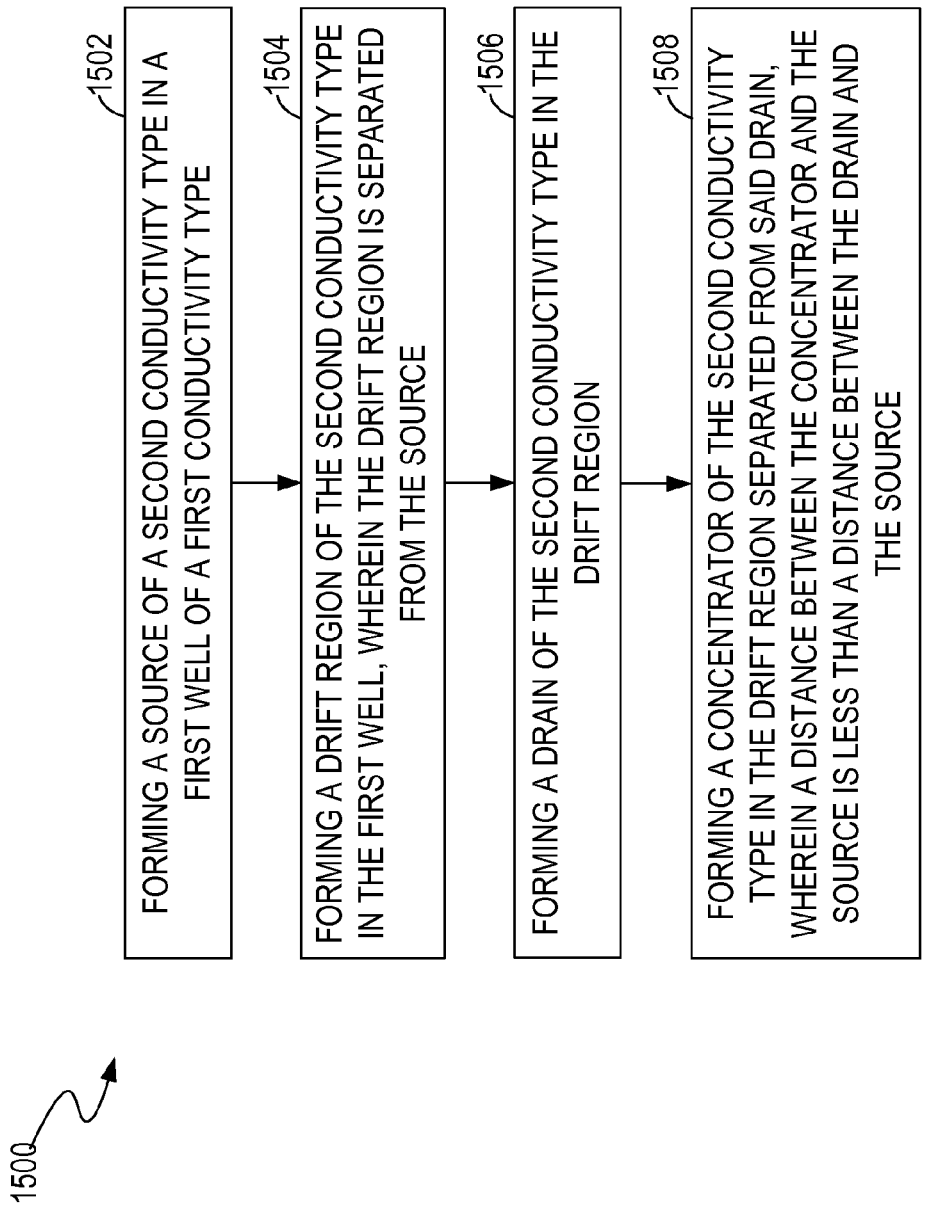
FIG. 15 illustrates a flowchart of operations for fabricating an LDMOS transistor, in an embodiment according to the present invention.

FIG. 15 illustrates a flow chart 1500 of a process for fabricating a LDMOS transistor, in an embodiment according to the present invention. FIG. 15 is described in combination with FIG. 2 to FIG. 9B. Although specific steps are disclosed in FIG. 15, such steps are examples. That is, the present invention is well suited to performing various other steps of variations of the steps recited in FIG. 15.

In block 1502, a source of a second conductivity type, e.g., the source contact 702, is formed in a first well of a first conductivity type, e.g., the well 206.

In block 1504, a drift region of the second conductivity type, e.g., the shallow drift region 406, is formed in the first well. The drift region is separated from the source.

In block 1506, a drain of the second conductivity type, e.g. the drain contact 704, is formed in the drift region.

In block 1508, a concentrator of the second conductivity type, e.g., the concentrator 706, is formed in the drift region separated from the drain. The distance between the concentrator and the source is less than the distance between the drain and the source. In one embodiment, the drain includes a pair of drain regions, e.g., the drain regions 704a and 704b. The concentrator is formed between the drain regions. In one embodiment, the concentrator includes a separated island of the second conductivity type. Alternatively, the concentrator includes multiple separated islands of the second conductivity type. In one embodiment, a window, e.g., the window 708a or the window 708b, is formed in the drift region and between the concentrator and the drain. The window constitutes a resistor coupled between the concentrator and the drain. In one embodiment, a second well of the second conductivity type, e.g., the well 306, is formed in the first well and below the drift region. In one embodiment, a buried layer, e.g., the buried layer 204, is formed between the first well and a substrate of the LDMOS transistor, e.g., the substrate 202. A frontier of the second well extends to the buried layer such that the buried layer and the second well separate the first well from other regions of the first conductivity. In one embodiment, the lateral distance between a first frontier of the second well, e.g. the frontier 308, and a second frontier of the concentrator, e.g., the frontier 714, is less than the lateral distance between a third frontier of the drift region, e.g. the frontier 408, and the second frontier.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A laterally-diffused metal-oxide-semiconductor (LDMOS) transistor comprising:
a first well of a first conductivity type;
a source of a second conductivity type formed in said first well;
a drift region of said second conductivity type formed in said first well and separated from said source;
a drain of said second conductivity type formed in said drift region; and
a concentrator of said second conductivity type formed in said drift region and separated from said drain, wherein the distance between said concentrator and said source is less than the distance between said drain and said source.

2. The LDMOS transistor as claimed in claim 1, wherein said concentrator comprises an island of said second conductivity type.

3. The LDMOS transistor as claimed in claim 1, further comprising:
a window in said drift region and between said concentrator and said drain, wherein said window constitutes a resistor coupled between said concentrator and said drain.

4. The LDMOS transistor as claimed in claim 1, wherein said drain comprises a pair of drain regions, and wherein said concentrator is formed between said drain regions.

5. The LDMOS transistor as claimed in claim 1, wherein the dopant density of said concentrator is greater than the dopant density of said drift region.

6. The LDMOS transistor as claimed in claim 1, wherein said LDMOS transistor further comprises:
a second well of said second conductivity type formed in said first well and below said drift region.

7. The LDMOS transistor as claimed in claim 6, wherein said LDMOS transistor further comprises:
a buried layer formed between said first well and a substrate of said LDMOS transistor, wherein a frontier of said second well extends to said buried layer such that said buried layer and said second well separate said first well from other regions of said first conductivity type.

8. The LDMOS transistor as claimed in claim 6, wherein the lateral distance between a first frontier of said second well and a second frontier of said concentrator is less than the lateral distance between a third frontier of said drift region and said second frontier.

9. The LDMOS transistor as claimed in claim 6, wherein the dopant density of said second well is less than the dopant density of said drift region.

10. The LDMOS transistor as claimed in claim 1, wherein said concentrator comprises a plurality of islands of said second conductivity type.

11. A method for fabricating LDMOS transistors, said method comprising:
forming a source of a second conductivity type in a first well of a first conductivity type;
forming a drift region of said second conductivity type in said first well, wherein said drift region is separated from said source;
forming a drain of said second conductivity type in said drift region; and
forming a concentrator of said second conductivity type in said drift region and separated from said drain, wherein the distance between said concentrator and said source is less than the distance between said drain and said source.

12. The method as claimed in claim 11, wherein said method further comprises:
forming a second well of said second conductivity type in said first well and below said drift region.

13. The method as claimed in claim 12, wherein said method further comprises:

forming a buried layer between said first well and a substrate of said LDMOS transistor, wherein a frontier of said second well extends to said buried layer such that said buried layer and said second well separate said first well from other regions of said first conductivity type.

14. The method as claimed in claim 12, wherein the lateral distance between a first frontier of said second well and a second frontier of said concentrator is less than the lateral distance between a third frontier of said drift region and said second frontier.

15. The method as claimed in claim 11, wherein said method further comprises:
   forming a window in said drift region and between said concentrator and said drain, wherein said window constitutes a resistor coupled between said concentrator and said drain.

16. The method as claimed in claim 11, wherein said drain comprises a pair of drain regions, and wherein said method further comprises:
   forming said concentrator between said drain regions.

17. The method as claimed in claim 11, wherein said concentrator comprises an island of said second conductivity type.

18. The method as claimed in claim 11, wherein said concentrator comprises a plurality of islands of said second conductivity type.

* * * * *